US010488572B2

(12) United States Patent
Ohkawa et al.

(10) Patent No.: US 10,488,572 B2
(45) Date of Patent: *Nov. 26, 2019

(54) LIGHT EMITTING UNIT, DISPLAY, AND LIGHTING APPARATUS

(71) Applicant: Saturn Licensing LLC, New York, NY (US)

(72) Inventors: Shingo Ohkawa, Saitama (JP); Tomoharu Nakamura, Tokyo (JP); Gen Yonezawa, Kanagawa (JP)

(73) Assignee: Saturn Licensing LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/880,083

(22) Filed: Jan. 25, 2018

(65) Prior Publication Data

US 2018/0164488 A1    Jun. 14, 2018

Related U.S. Application Data

(63) Continuation of application No. 15/212,848, filed on Jul. 18, 2016, now Pat. No. 9,915,769, which is a
(Continued)

(30) Foreign Application Priority Data

Apr. 11, 2012   (JP) ................................. 2012-090214

(51) Int. Cl.
*F21V 7/04* (2006.01)
*F21V 8/00* (2006.01)
(Continued)

(52) U.S. Cl.
CPC ......... *G02B 6/0031* (2013.01); *G02B 6/0023* (2013.01); *G02B 6/0026* (2013.01);
(Continued)

(58) Field of Classification Search
CPC .. G02B 6/0031; G02B 6/0026; G02B 6/0055; G02B 6/0023; G02B 6/005;
(Continued)

(56) References Cited

U.S. PATENT DOCUMENTS 6,501,091 B1   12/2002   Bawendi et al.
6,803,719 B1   10/2004   Miller et al.
(Continued)

FOREIGN PATENT DOCUMENTS

EP    2392852 A2    12/2011
EP    2565706 A1    3/2013
(Continued)

OTHER PUBLICATIONS

European Search Report from EP Application No. 13162081,dated Aug. 13, 2013.
(Continued)

*Primary Examiner* — William J Carter
*Assistant Examiner* — Omar Rojas Cadima
(74) *Attorney, Agent, or Firm* — Lerner, David, Littenberg, Krumholz & Mentlik, LLP

(57) ABSTRACT

There are provided a light emitting unit that enhances the uniformity of in-plane colors, as well as a display and a lighting apparatus that include such a light emitting unit thereon. The light emitting unit includes: a plurality of light emitting sections each having a light source and a wavelength conversion member, the wavelength conversion member converting a wavelength of light emitted from the light source; an optical component having a light incident surface in opposition to the plurality of light emitting sections; and a color unevenness prevention structure suppressing direct entering of light from the light source into the optical component.

22 Claims, 19 Drawing Sheets

Related U.S. Application Data continuation of application No. 13/856,033, filed on Apr. 3, 2013, now Pat. No. 9,423,554.

(51) Int. Cl.
  *G02F 1/1335* (2006.01)
  *H01L 33/50* (2010.01)
  *F21K 9/64* (2016.01)

(52) U.S. Cl.
  CPC ..... *G02B 6/0055* (2013.01); *G02F 1/133615* (2013.01); *H01L 33/505* (2013.01); *F21K 9/64* (2016.08); *G02F 2001/133614* (2013.01)

(58) Field of Classification Search
  CPC .. G02B 6/0073; G02B 6/0053; G02B 6/0068; G02B 6/0051; G02B 6/0028; G02B 6/0025; G02B 27/2214; H01L 33/505; G02F 1/133615; G02F 1/133514; G02F 2001/133614; F21K 9/64; B82Y 20/00
  See application file for complete search history.

(56) References Cited

U.S. PATENT DOCUMENTS

| | | | |
|---|---|---|---|
| 9,423,554 B2* | 8/2016 | Ohkawa | G02F 1/133615 |
| 2002/0015297 A1 | 2/2002 | Hayashi et al. | |
| 2003/0038295 A1 | 2/2003 | Koda | |
| 2004/0257797 A1 | 12/2004 | Suehiro et al. | |
| 2007/0189009 A1 | 8/2007 | Ho | |
| 2007/0257797 A1 | 11/2007 | Rancien et al. | |
| 2008/0284316 A1* | 11/2008 | Kurihara | H05B 33/145 313/503 |
| 2009/0122217 A1 | 5/2009 | Chen et al. | |
| 2010/0051898 A1* | 3/2010 | Kim, II | C09K 11/02 257/9 |
| 2010/0096965 A1 | 4/2010 | Oyaizu et al. | |
| 2010/0149783 A1 | 6/2010 | Takenaka et al. | |
| 2011/0121731 A1 | 5/2011 | Tsutsumi et al. | |
| 2011/0157914 A1 | 6/2011 | Chang | |
| 2011/0176328 A1* | 7/2011 | Anandan | G02B 6/0036 362/606 |
| 2011/0317283 A1 | 12/2011 | Shim | |
| 2012/0127397 A1 | 5/2012 | Yamamoto et al. | |
| 2013/0050616 A1 | 2/2013 | Seo et al. | |

FOREIGN PATENT DOCUMENTS

| | | |
|---|---|---|
| JP | 05088174 A * | 4/1993 |
| JP | 03114805 B2 | 12/2000 |
| JP | 3116727 B2 | 12/2000 |
| JP | 2004219926 A | 8/2004 |
| JP | 2005093681 A | 4/2005 |
| JP | 2007286627 A | 11/2007 |
| JP | 2008010228 A | 1/2008 |
| JP | 2009231273 A | 10/2009 |
| JP | 2009265634 A | 11/2009 |
| JP | 2010123918 A | 6/2010 |
| JP | 2010129359 A | 6/2010 |
| JP | 2011258951 A | 12/2011 |
| JP | 2011529621 A | 12/2011 |
| JP | 2012169189 A | 9/2012 |
| JP | 2013218954 A | 10/2013 |
| WO | 2011013733 A1 | 2/2011 |

OTHER PUBLICATIONS

Japanese Office Action for JP 2012-090214 dated Jan. 26, 2016.
Japanese Office Action for Application No. JP 2012090214 dated Oct. 4, 2016.
Japanese Office Action for Application No. 201310115810.7, dated Aug. 1, 2017.
Notification of Reasons for Refusal of Japanese Application 2017-154095 dated Jun. 2, 2018.

* cited by examiner

LIGHT EMITTING UNIT, DISPLAY, AND LIGHTING APPARATUS

CROSS-REFERENCE TO RELATED APPLICATION

The present application is a continuation of U.S. patent application Ser. No. 15/212,848, filed Jul. 18, 2016 which is a continuation of U.S. patent application Ser. No. 13/856,033, filed Apr. 3, 2013, (U.S. Pat. No. 9,423,554), which claims priority from Japanese Patent Application No. JP 2012-090214 filed in the Japanese Patent Office on Apr. 11, 2012, the entire content of which is incorporated herein by reference.

BACKGROUND

The present technology relates to a light emitting unit that is suited for use in a surface light source, as well as a display and a lighting apparatus that include such a light emitting unit thereon.

A surface-emitting unit using a blue-color LED (Light emitting Diode) has been adopted for a backlight of a liquid crystal display, a lighting apparatus, or the like. For example, Japanese Patent No. 3116727 describes that a film with a fluorescent material coated thereon is provided on an emission observation surface (light emission surface) of a light guide plate to perform a wavelength conversion of light incoming from a blue-color LED to the light guide plate by means of the fluorescent material for obtaining white-color light. Further, Japanese Patent No. 3114805 mentions that a wavelength conversion element with an elastic body mixed with a fluorescent material is provided between a blue-color LED and an end surface (light incident surface) of a light guide plate.

SUMMARY

In a light emitting unit to be used as a surface light source, it is highly preferable to enhance the uniformity of in-plane colors (chromaticity) as a general rule.

It is desirable to provide a light emitting unit that enhances the uniformity of in-plane colors, as well as a display and a lighting apparatus that include such a light emitting unit thereon.

According to an embodiment of the present disclosure, there is provided a light emitting unit including: a plurality of light emitting sections each having a light source and a wavelength conversion member, the wavelength conversion member converting a wavelength of light emitted from the light source; an optical component having a light incident surface in opposition to the plurality of light emitting sections; and a color unevenness prevention structure suppressing direct entering of light from the light source into the optical component.

According to an embodiment of the present disclosure, there is provided a display with a light emitting unit at a rear side of a liquid crystal panel. The light emitting unit includes: a plurality of light emitting sections each having a light source and a wavelength conversion member, the wavelength conversion member converting a wavelength of light emitted from the light source; an optical component having a light incident surface in opposition to the plurality of light emitting sections; and a color unevenness prevention structure suppressing direct entering of light from the light source into the optical component.

According to an embodiment of the present disclosure, there is provided a lighting apparatus with a light emitting unit. The light emitting unit includes: a plurality of light emitting sections each having a light source and a wavelength conversion member, the wavelength conversion member converting a wavelength of light emitted from the light source; an optical component having a light incident surface in opposition to the plurality of light emitting sections; and a color unevenness prevention structure suppressing direct entering of light from the light source into the optical component.

In the light emitting unit, the display, or the lighting apparatus according to the above-described respective embodiments of the present technology, a color unevenness prevention structure reduces the amount of light incoming into an optical component without passing through a wavelength conversion member among light that is generated by a light source. More specifically, light from the light source reaches a light incident surface of the optical component with a wavelength thereof converted by the wavelength conversion member.

According to the light emitting unit, the display, and the lighting apparatus according to the above-described respective embodiments of the present technology, provision of the color unevenness prevention structure makes it possible to prevent an in-plane color of light from the light source from being much more highly visible than a color of light passing through the wavelength conversion member. This allows to prevent any color unevenness, thereby enhancing the uniformity of an in-plane color of light.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Hereinafter, some preferred embodiments of the present technology are described in detail with reference to the drawings. It is to be noted that the descriptions are provided in the order given below.

1. First Embodiment (a light emitting unit: an example where a reflection section is provided between adjacent wavelength conversion members)
2. Modification Example 1 (an example where a reflection section is composed of a part of a holder holding a wavelength conversion member)
3. Modification Example 2 (an example where a light absorber section is provided between adjacent wavelength conversion members)
4. Second Embodiment (a light emitting unit: an example where a wavelength conversion section is provided between adjacent wavelength conversion members)
5. Modification Example 3 (an example where a wavelength conversion film covering an end of a container of a wavelength conversion member is used as a wavelength conversion section)
6. Third Embodiment (a light emitting unit: an example where a pitch at which the closest light sources are arranged between adjacent light emitting sections is greater than a pitch at which adjacent light sources are arranged within one light emitting section)
7. Application Examples (displays and lighting apparatuses)

1. First Embodiment

Figure 1:
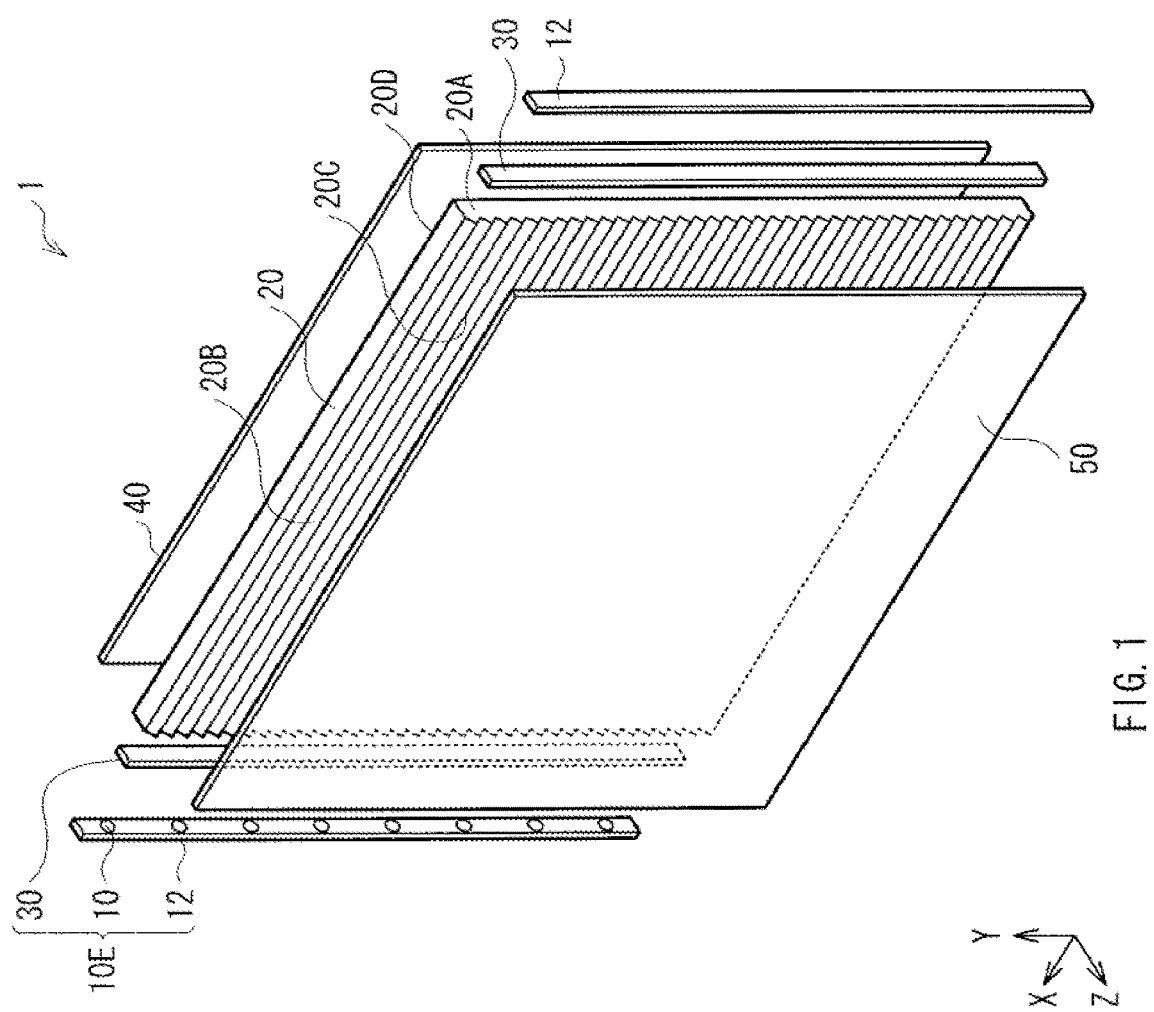
FIG. 1 is a perspective view showing an overall configuration of a light emitting unit according to a first embodiment of the present technology.

FIG. 1 shows an overall configuration of a light emitting unit (light emitting unit 1) according to a first embodiment of the present technology. The light emitting unit 1, which may be used, for example, as a backlight of illuminating a transmissive liquid crystal panel from behind, has a light emitting section 10E including a light source 10 and a wavelength conversion member 30, a light guide plate 20 (optical component), a reflective member 40, and an optical sheet 50. In the light guide plate 20, each of both left and right end surfaces thereof is designated as a light incident surface 20A, and principal surfaces thereof (the widest surfaces) at front and rear sides are designated as light emission surfaces 20B and 20D. In other words, the light emitting unit 1 is an edge-lit type light emitting unit.

In the present specification, a laminating direction of the optical sheet 50, the light guide plate 20, and the reflective member 40 is called Z-direction (front-rear direction), a lateral direction of a principal surface of the light guide plate 20 is called X-direction, and a vertical direction thereof is called Y-direction.

The light source 10 is, for example, an LED generating blue-color light (for example, with a wavelength of about 430 nm to about 495 nm both inclusive), and the plurality of light sources 10 is provided in opposition to the light incident surface 20A of the light guide plate 20. More specifically, the light source 10 is sealed into a package (later-described package 11 shown in FIG. 2), being mounted on a light source substrate 12. The light source substrate 12 supports the light source 10 and supplies an electrical power to the light source 10. The light source substrate 12 has a wiring pattern on a glass epoxy substrate, a metallic substrate, or a flexible substrate in rectangular forms, for example. The plurality of light sources 10 is disposed along a longitudinal direction (Y-direction) of the rectangular light source substrate 12. A single light source 10 may be only disposed, or a single light source 10 may be provided on a single light source substrate 12, and a plurality of such configurations may be disposed alternatively.

The wavelength conversion member 30 is provided between the light source 10 and the light incident surface 20A of the light guide plate 20. The wavelength conversion member 30 absorbs light at a wavelength that is generated by the light source 10, and subsequently generates light at a wavelength different from that of the absorbed light. In other words, light from the light source 10 is partly or wholly subject to a wavelength conversion performed by the wavelength conversion member 30, and then comes into the light incident surface 20A.

Figure 2:
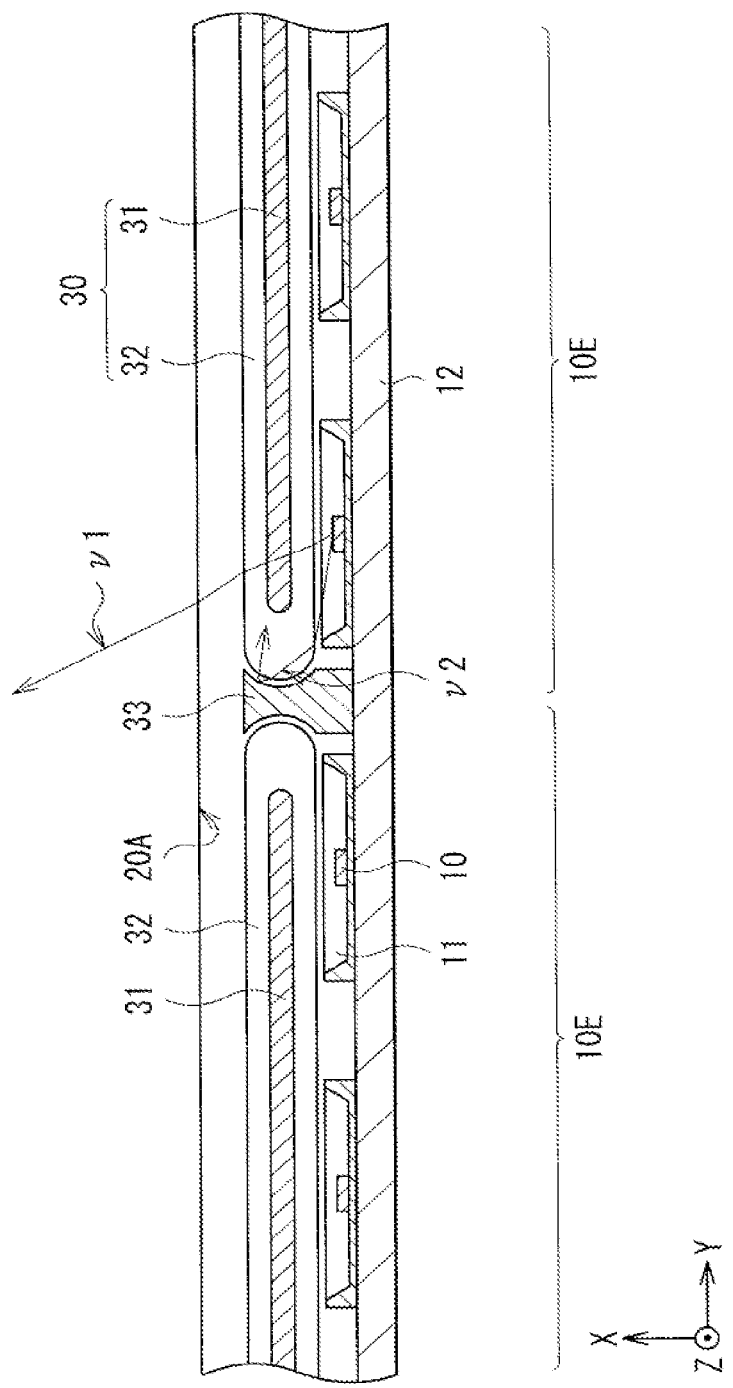
FIG. 2 is a schematic diagram showing a bundle of light rays heading from a light source toward a light incident surface of a light guide plate illustrated in FIG. 1.

FIG. 2 shows a part of the wavelength conversion member 30 on a magnified scale. The wavelength conversion member 30 is a member in which a wavelength conversion material 31 is sealed into a tubular container 32 (capillary) that is composed of a material such as glass. The wavelength conversion material 31 may contain, for example, a fluorescent pigment, a fluorescent dye, quantum dots, and the like, and absorbs light from the light source 10 to convert it into light at a different wavelength for emission (for example, light v1 shown in FIG. 2). For example, the wavelength conversion material 31 absorbs blue-color light from the light source 10 to convert a part of the light into red-color light (wavelength of about 620 nm to about 750 nm both inclusive) or green-color light (wavelength of about 495 nm to about 570 nm both inclusive). As a result, light from the light source 10 passes through the wavelength conversion material 31, which synthesizes red-color light, green-color light, and blue-color light to generate white-color light. The container 32 has a role of facilitating the handling of the wavelength conversion material 31, while suppressing any deterioration of the wavelength conversion material 31 that is caused by moisture or oxygen in the atmosphere.

It is preferable that the wavelength conversion material 31 contain the quantum dots. The quantum dot is a particle with a diameter of about 1 nm to about 100 nm both inclusive, and has a discrete energy level. Since an energy state of the quantum dot depends on a size thereof, a variation in size allows a light emitting wavelength to be selected freely. Further, light emitted from the quantum dot has a narrow spectral width. A combination of light with such a steep peak extends a color gamut. Therefore, use of the quantum dot for the wavelength conversion material 31 makes it possible to extend a color gamut with ease. In addition, the quantum dot exhibits high responsive property, allowing light from the light source 10 to be utilized efficiently. Moreover, the quantum dot also has high stability. For example, the quantum dot may be a compound of 12-group element and 16-group element, a compound of 13-group element and 16-group element, or a compound of 14-group element and 16-group element, such as CdSe, CdTe, ZnS, CdS, PdS, PbSe, and CdHgTe.

Figure 3A:
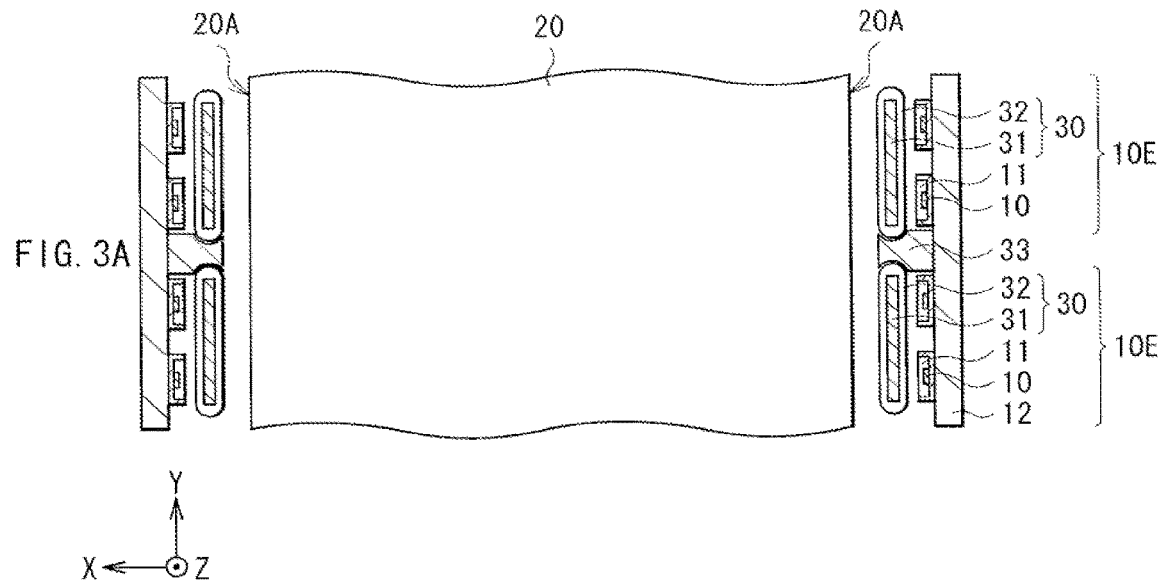
FIGS. 3A and 3B are each a cross-sectional view for explaining a configuration of a light emitting section illustrated in FIG. 1.

As shown in FIG. 3A, one light emitting section 10E includes one wavelength conversion member 30 and the plurality of light sources 10 that emit light into the wavelength conversion member 30, and the light emitting unit 1 is provided with the plurality of light emitting sections 10E in opposition to one light incident surface 20A (for example, right end surface of the light guide plate 20 shown in FIG. 3A). The container 32 (wavelength conversion material 31) extends toward a length direction (Y-direction) of the light incident surface 20A, and the light emitting sections 10E are placed side-by-side along such an extending direction.

Figure 3B:
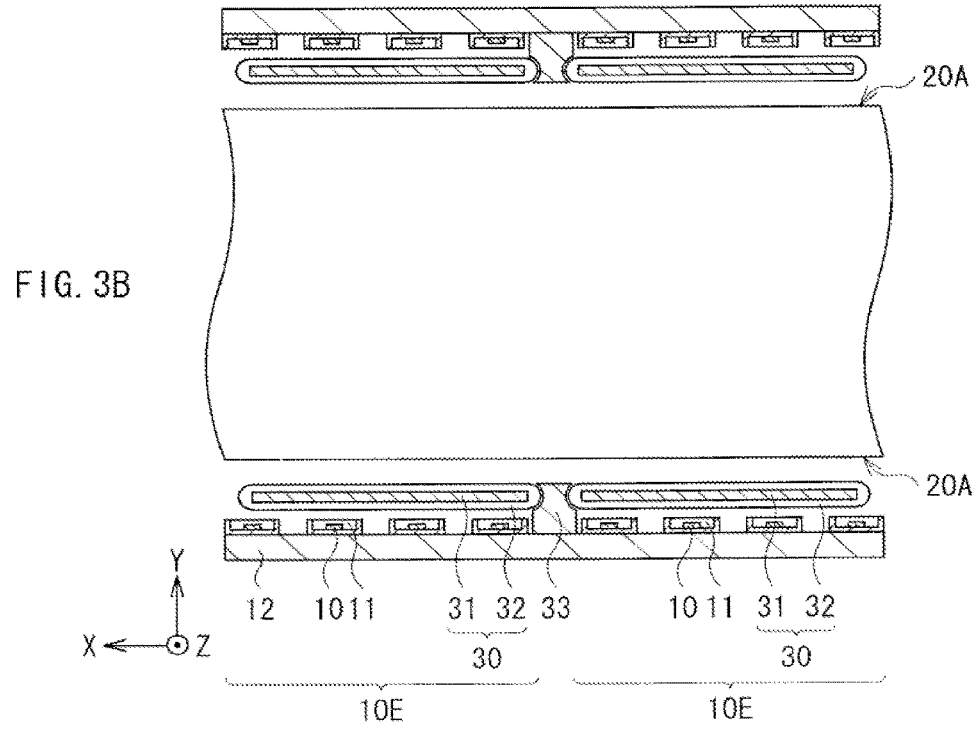

When the light incident surface 20A of the light guide plate 20 corresponds to both upper and lower end surfaces, the plurality of light emitting sections 10E are disposed along X-direction as shown in FIG. 3B. When a size of a display panel onto which the light emitting unit 1 irradiates light is large (for example, 55 inches or more), it is especially preferable that the plurality of light emitting sections 10E be provided in such a manner to maintain the reliability of the container 32. Alternatively, arrangement of the light emitting section 10E on a long side of the light guide plate 20 with a rectangular planar surface (FIG. 3B) increases the luminance in comparison with a case of arrangement on a short side (FIG. 3A).

In this embodiment of the present disclosure, a reflection section 33 is provided between the adjacent light emitting sections 10E. The reflection section 33 composes a color unevenness prevention structure to shield any light heading directly toward the light incident surface 20A of the light guide plate 20 without allowing the light to pass through the wavelength conversion member 30 from the light source 10, which is hereinafter described in details.

The reflection section 33 is provided between the adjacent containers 32, and covers ends of those two containers 32 by a circular concave section, for example (FIG. 2). The reflection section 33 returns light v2 heading from the light source 10 toward a position between the adjacent containers 32 back to the wavelength conversion member 30 (wavelength conversion material 31) side, and is composed of a highly reflective material, including, for example, a white-color resin and a resin mixed with a metal exhibiting high reflectance, such as titanium oxide. Examples of this resin material may include PC (polycarbonate), PPA (polyphthalamide), PPA/PCT (polycyclohexylene dimethylene terephthalate), or epoxy resin. Alternatively, the reflection section 33 may be composed of a material such as a metal with highly reflective coating applied thereon. The reflection section 33 is provided over an area from a position between the above-described adjacent containers 32 to a position between the adjacent light sources 10, and is fixed to a part of the light emitting section 10E, such as the light source substrate 12. The reflection section 33 may be in the form of a cap that covers only an end of the container 32, and may be separated between one end and the other end of both ends of two adjacent containers 32.

The light guide plate 20, which is composed mainly to include a transparent thermoplastic resin, such as polycarbonate resin (PC) and acrylic resin, guides light that comes into the light incident surface 20A from the light source 10 to the light emission surface 20B (a principal surface on the optical sheet 50 side in FIG. 1). On the light emission surface 20B, there is provided an uneven pattern composed of, for example, microscopic convex sections 20C to improve the straightness of light that is propagated through the light guide plate 20. The convex section 20C may be, for example, a belt-shaped protrusion or ridge that extends toward one direction (X-direction shown in FIG. 1) of the light emission surface 20B. On the light emission surface 20D in opposition to the light emission surface 20B, for example, a scattering agent is printed in a pattern form as a scattering section to scatter and equalize light that is propagated through the light guide plate 20. As the scattering section, instead of the scattering agent, any section including filler may be provided, or a top surface may be partly roughened alternatively.

The reflective member 40 (FIG. 1) is a plate-like or sheet-like member in opposition to a principal surface of the light guide plate 20, and is provided at the light emission surface 20D side of the light guide plate 20. The reflective member 40 returns light that leaks out of the light source 10 into the light emission surface 20D side of the light guide plate 20, and light that is emitted from the inside of the light guide plate 20 to the light emission surface 20D side thereof, back to the light guide plate 20 side. The reflective member 40 has capabilities including reflection, diffusion, and scattering, for example. This makes it possible to utilize light efficiently for increasing the front-side luminance.

The reflective member 40 may be composed of, for example, a foamed PET (polyethylene terephthalate), an evaporated silver film, a multilayer reflective film, or white-color PET. When a capability of regular reflection (specular reflection) is incorporated in the reflective member 40, it is preferable that a treatment such as silver evaporation, aluminum evaporation, or multilayer evaporation be carried out on a top surface thereof. If the reflective member 40 has a microscopic form, it is possible to form such a microscopic form in an integrated manner in a method such as hot press molding or melt extrusion molding using a thermoplastic resin, for example. Examples of the thermoplastic resin may include an acrylic resin such as PC and PMMA (polymethyl methacrylate), a polyester resin such as PET, an amorphous copolymer polyester resin such as MS (copolymer of methyl methacrylate and styrene), a polystyrene resin, and a polyvinyl chloride resin. Alternatively, the microscopic form may be formed in such a manner that an energy radiation (for example, ultraviolet light) cured resin is applied on a substrate composed of PET or glass, and subsequently a pattern is transcribed on the substrate.

The optical sheet 50 is provided on the light emission surface 20B side of the light guide plate 20, and may include a diffusion plate, a diffusion sheet, a lens film, a polarization split sheet, and the like. FIG. 1 shows only one sheet of the plurality of above-described optical sheets 50. Provision of the optical sheet 50 makes it possible to rise light outgoing from the light guide plate 20 in an oblique direction toward a front-side direction, thereby allowing to further increase the front-side luminance.

In the light emitting unit 1, light that is generated by the light source 10 comes into the light incident surface 20A of the light guide plate 20 with a wavelength thereof converted by the wavelength conversion member 30. This light moves through the light guide plate 20, and is emitted from the light emission surface 20B to pass through the optical sheet 50.

In this embodiment of the present disclosure, the reflection section 33 is provided between the adjacent light emitting sections 10E, which makes it possible to reduce the amount of light that comes into the light incident surface 20A of the light guide plate 20 directly from the light source 10 without passing through the wavelength conversion member 30.

Figure 4A:
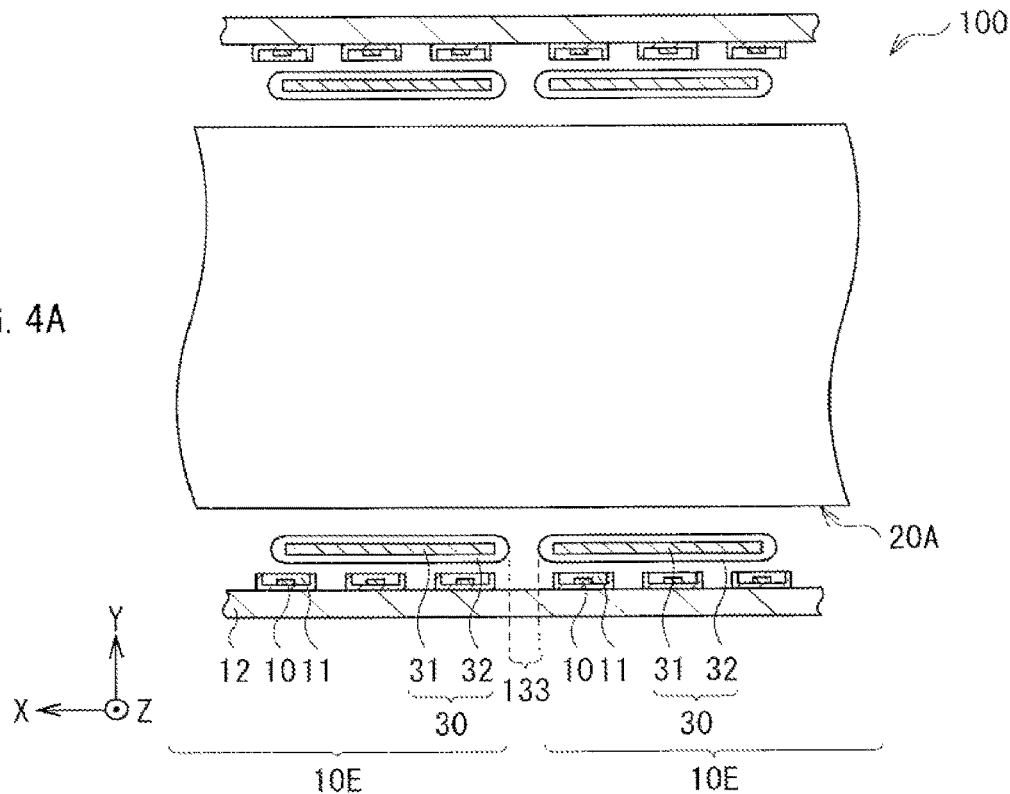
FIGS. 4A and 4B are each a schematic diagram showing a configuration of a light emitting unit according to a comparative example.

FIG. 4A shows a planar configuration of a light emitting unit 100 according to a comparative example as viewed from a light emission surface (XY plane). As with the above-described light emitting unit 1, in the light emitting unit 100, a plurality of light emitting sections 10E are provided in opposition to one light incident surface 20A (for example, lower end surface) of a light guide plate 20.

Figure 4B:
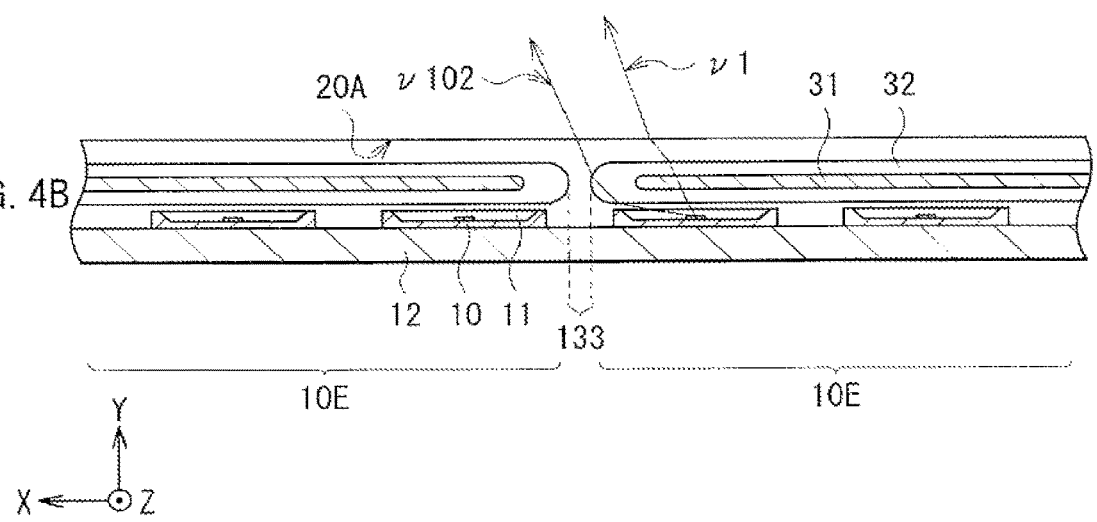

However, there exists no light shielding structure such as a reflection section between the adjacent light emitting sections 10E. In a container 32 composed of a material such as glass, thermal expansion and contraction may arise, which prevents the containers 32 from being fixed in contact with each other, and thus a spacing interval (spacing interval 133) is provided between the adjacent containers 32. Further, due to thickness or the like of the container 32, a section in which the wavelength conversion material 31 is not sealed is present at an end of the container 32. On the light incident surface 20A of such a light emitting unit 100, as shown in FIG. 4B, in addition to the light v1 that has passed through the wavelength conversion material 31 of the wavelength conversion member 30 from the light source 10, light v102 also arrives that has passed between the adjacent containers 32 (wavelength conversion material 31). The light v102 has the same wavelength as with light that is generated by the light source 10.

Figure 5:
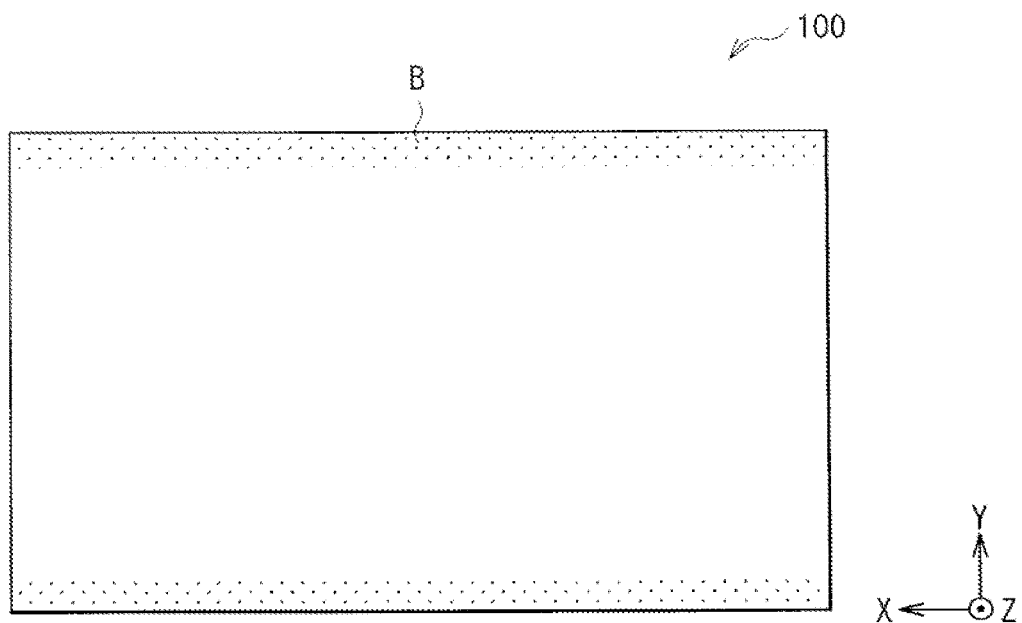
FIG. 5 is a top view showing light to be observed from the light emitting unit illustrated in FIGS. 4A and 4B.

In this case, as shown in FIG. 5, in the light emitting unit 100, color unevenness B tinged with blue that is caused by the light v102 is observed along sides (for example, upper and lower sides) where the light emitting sections 10E are provided.

On the contrary, in the first embodiment of the present disclosure, the reflection section 33 is provided between the adjacent containers 32, and thus the light v2 (FIG. 2) heading from the light source 10 toward a position between the light emitting sections 10E is returned back to the wavelength conversion material 31 side by the reflection section 33, and then is subject to wavelength conversion. Therefore, it is possible to prevent that the light from the light source 10 reaches the light incident surface 20A of the light guide plate 20 directly without passing through the wavelength conversion member 30. This makes it possible to suppress generation of any color unevenness that is caused by blue-color light of the light source 10, thereby allowing to enhance the uniformity of an in-plane color of light.

As described above, in the first embodiment of the present disclosure, the reflection section 33 is provided between the adjacent light emitting sections 10E, which makes it possible to reduce the amount of light incoming into the light incident surface 20A of the light guide plate 20 directly from the light source 10, thereby allowing to enhance the uniformity of an in-plane color of light.

Hereinafter, the descriptions are provided on modification examples of the above-described embodiment of the present disclosure, and other embodiments of the present disclosure. It is to be noted that, in the following descriptions, any component parts essentially same as the above-described embodiment of the present disclosure are denoted with the same reference numerals, and the related descriptions are omitted as appropriate.

Modification Example 1

Figure 6:
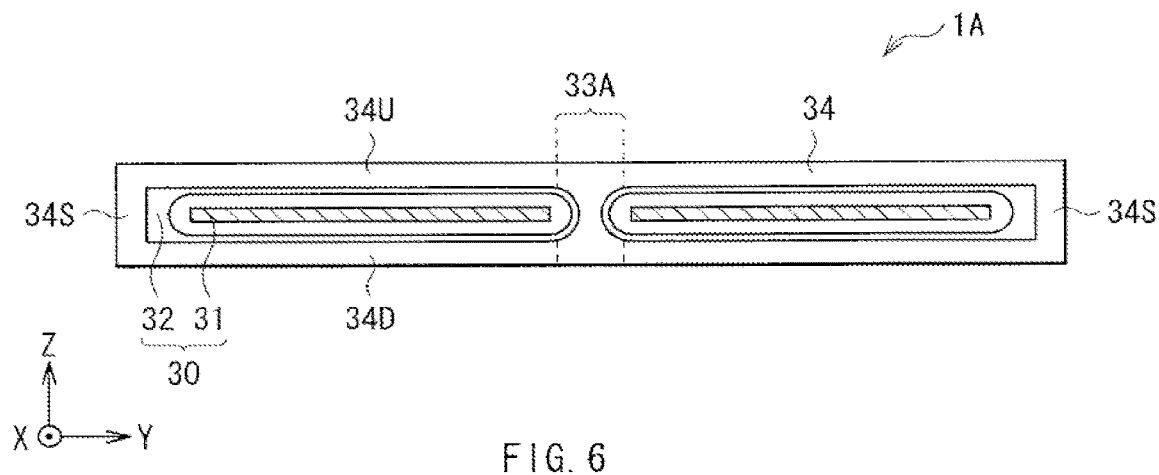
FIG. 6 is a top view showing a configuration of a light emitting section according to a modification example 1.

FIG. 6 shows a planar configuration of a light emitting unit (light emitting unit 1A) according to a modification example 1 of the above-described first embodiment of the present disclosure as viewed from the light incident surface 20A of the light guide plate 20. In the light emitting unit 1A, a reflection section is composed of a part (barrier section 33) of a holder (holder 34) holding the wavelength conversion member 30. Except for this point, the light emitting unit 1A has the same configuration as with the light emitting unit 1 according to the above-described first embodiment of the present disclosure, and the same goes for the operation and advantageous effects thereof as well.

The holder 34 has a function of fixing the wavelength conversion member 30 to hold a spacing interval between the wavelength conversion member 30 and the light source 10 at a predetermined value. This makes it possible to prevent the wavelength conversion member 30 and the light source 10 from being brought into contact with each other due to, for example, thermal expansion or the like. The holder 34 may be in the form of, for example, an approximately rectangular solid, and has an opening in opposition to a direction (X-direction) of light passing from the light source 10 to the light incident surface 20A. In concrete terms, the holder 34 is composed of an upper surface section 34U and a lower surface section 34D that interpose the wavelength conversion member 30 in a direction perpendicular to an extending direction of the container 32, as well as a pair of sidewalls 34S that join the upper surface section 34U with the lower surface section 34D. This holder 34 has a barrier section 33A. The barrier section 33A faces the sidewalls 34S with the container 32 (wavelength conversion material 31) interposed between, and is disposed between the wavelength conversion members 30 that are adjacent to one another at the time of accommodation of the wavelength conversion members 30 in the holder 34. This makes it possible to reduce the amount of light incoming into the light incident surface 20A of the light guide plate 20 directly from the light source 10.

The barrier section 33A is provided over an area from the upper surface section 34U to the lower surface section 34D, and a section thereof in opposition to an end of the container 32 is formed, for example, in a circular concave shape to cover the end of the container 32. The barrier section 33A has a function of preventing the adjacent containers 32 from being brought into contact with one another, as well as the same function as with the reflection section 33 of the above-described light emitting unit 1, that is, the function of returning light heading from the light source 10 toward a position between the adjacent containers 32 back to the wavelength conversion members 30 (wavelength conversion material 31) side. The holder 34 having the barrier section 33A may be composed of, for example, a resin mixed with metal exhibiting high reflectance, such as titanium oxide. Examples of the resin material may include PC (polycarbonate), PPA (polyphthalamide), PPA/PCT (polycyclohexylene dimethylene terephthalate), or epoxy resin. When the container 32 is made of glass, it is preferable to use the PPA with a thermal expansion coefficient close to that of glass and a benefit in terms of a cost. Specific examples of a PPA product include "Genstar®" that is manufactured by Kuraray Co., Ltd., and the like. Alternatively, the holder 34 may be composed of a material such as metal with highly reflective coating applied thereon.

Figure 7:
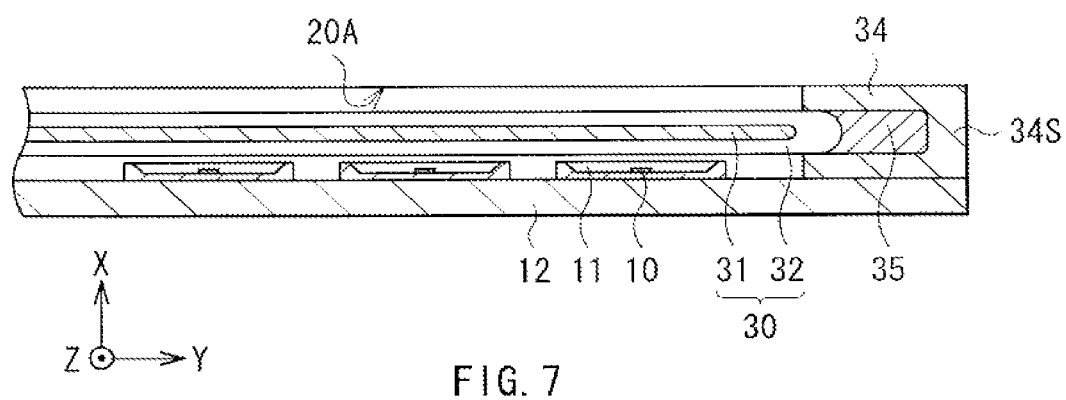
FIG. 7 is a cross-sectional view showing an example of a configuration between an end of a container and a holder illustrated in FIG. 6.

As shown in FIG. 7, it is preferable to provide a buffer member 35 between an end on the sidewall 34S side of the container 32 and the holder 34. Use of this buffer member 35 allows to prevent the container 32 and the holder 34 from being brought into contact with each other, and to clamp the container 32 against the barrier section 33A side for keeping the arrangement of the barrier section 33A and the container 32 with stability. As the buffer member 35, an elastic body such as urethane foam may be used.

Modification Example 2

A light emitting unit (light emitting unit 1B) according to a modification example 2 of the above-described first embodiment of the present disclosure has a light absorber section (light absorber section 36) between the adjacent light emitting sections 10E, as a color unevenness prevention structure. Except for this point, the light emitting unit 1B has the same configuration as with the light emitting unit 1 according to the above-described first embodiment of the present disclosure, and the same goes for the operation and advantageous effects thereof as well.

Figure 8:
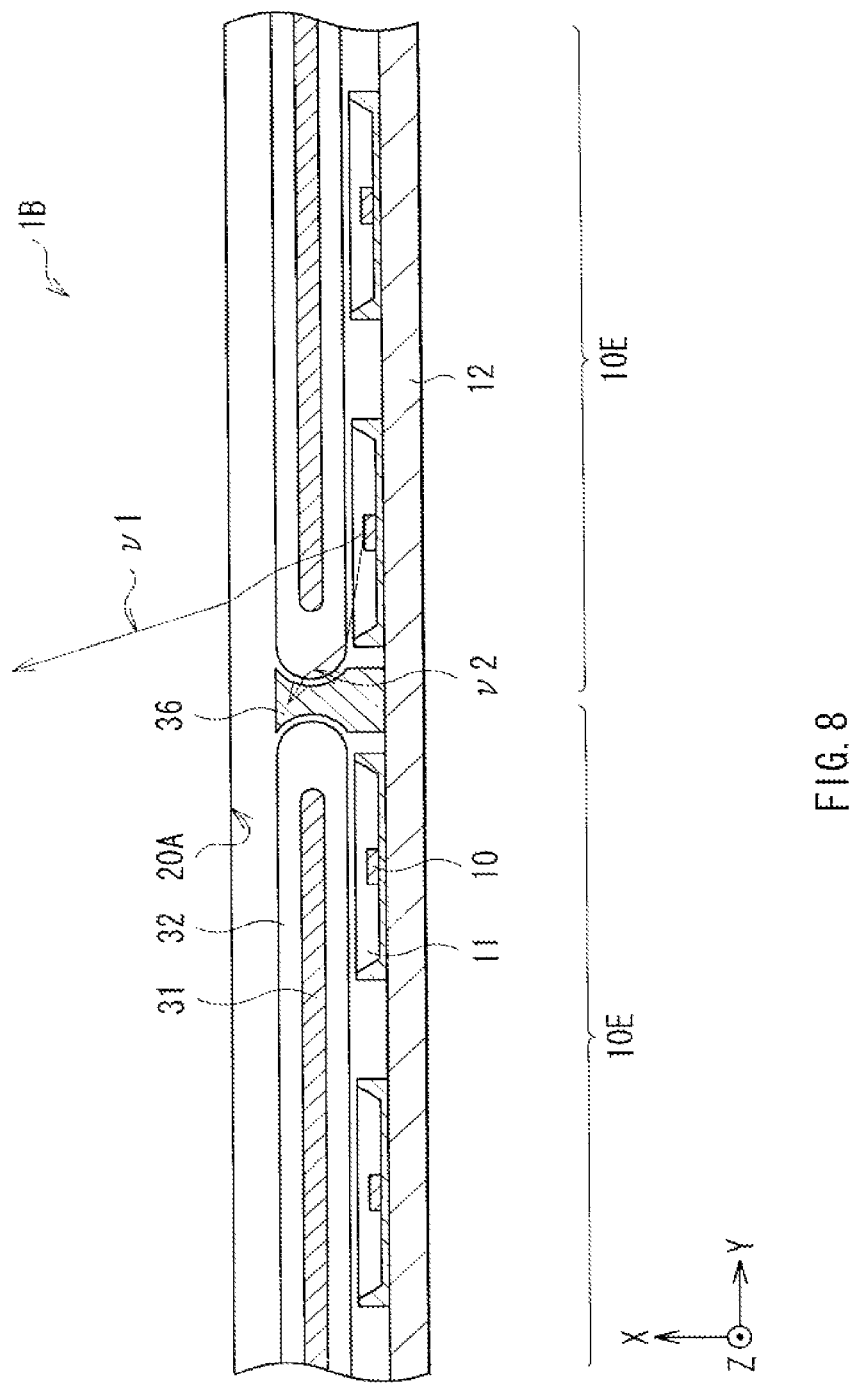
FIG. 8 is a cross-sectional view showing a configuration of a light emitting section according to a modification example 2.

As shown in FIG. 8, the light absorber section 36 is provided between the adjacent containers 32, and for example, circular concave sections thereof cover ends of the containers 32. The light absorber section 36 is intended to absorb and shield the light v2 heading from the light source 10 toward a position between the adjacent containers 32, and is composed of a material, such as black PC, black PPA, or black urethane foam. As compared with the light emitting unit 1, the light emitting unit 1B exhibits lower luminance, although has a higher capability of enhancing the color uniformity.

Second Embodiment

A light emitting unit (light emitting unit 2) according to a second embodiment of the present disclosure has a wavelength conversion section (wavelength conversion section 37) between the adjacent light emitting sections 10E, as a color unevenness prevention structure. Except for this point, the light emitting unit 2 has the same configuration as with the light emitting unit 1 according to the above-described first embodiment of the present disclosure, and the same goes for the operation and advantageous effects thereof as well.

Figure 9:
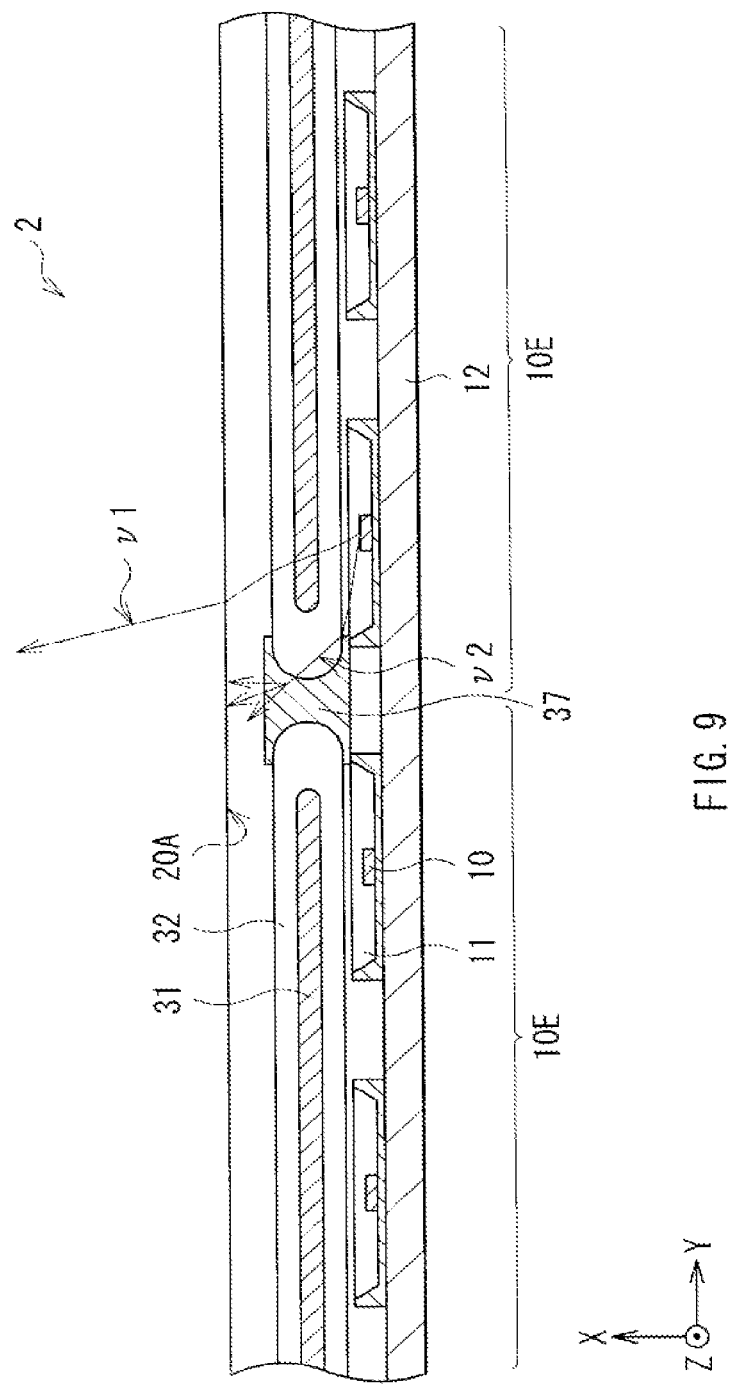
FIG. 9 is a cross-sectional view showing a configuration of a light emitting section according to a second embodiment of the present technology.

As shown in FIG. 9, the wavelength conversion section 37 is provided between the adjacent containers 32, and for example, circular concave sections thereof cover ends of the containers 32. The wavelength conversion section 37 is intended to convert a wavelength of the light v2 heading from the light source 10 toward a position between the adjacent containers 32. More specifically, the wavelength conversion section 37 absorbs blue-color light from the light source 10 to emit light different from the blue-color light in wavelength, such as red-color light or green-color light. This makes it possible to reduce the amount of light incoming into the light incident surface 20A of the light guide plate 20 directly from the light source 10, thereby allowing to enhance the color uniformity in the light emitting unit 2. In addition, it is possible to make efficient use of light that is generated by the light source 10, which allows the luminance to be enhanced as compared with the above-described first embodiment of the present disclosure. The wavelength conversion section 37 may be composed of, for example, a resin material mixed with a fluorescent material, such as fluorescent pigment and fluorescent dye. As the resin material, a material such as silicone may be used. The wavelength conversion section 37 may be separated between one end and the other end of ends of the adjacent containers 32.

Modification Example 3

A light emitting unit (light emitting unit 2A) according to a modification example 3 of the above-described second embodiment of the present disclosure has a wavelength conversion film (wavelength conversion film 38) as a wavelength conversion section at each end of the containers 32. Except for this point, the light emitting unit 2A has the same configuration as with the light emitting unit 2 according to the above-described second embodiment of the present disclosure, and the same goes for the operation and advantageous effects thereof as well.

Figure 10:
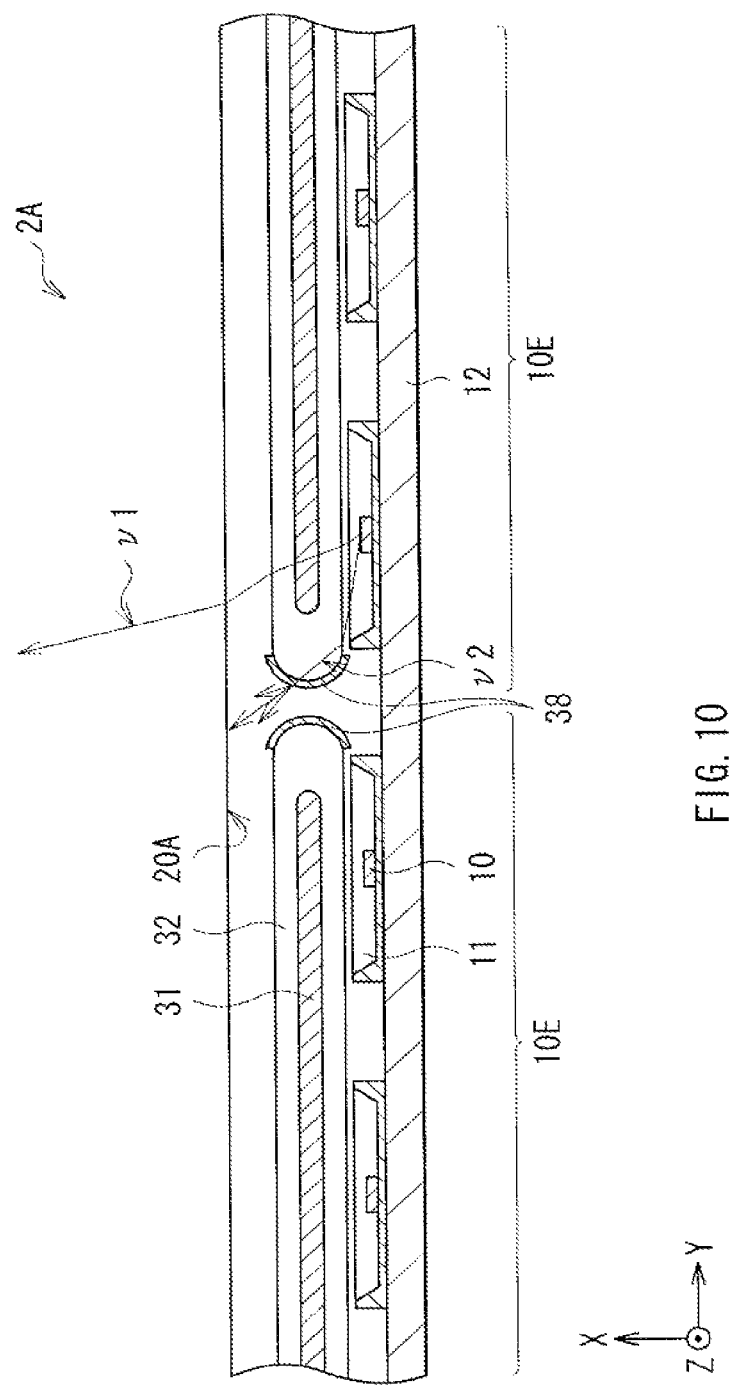
FIG. 10 is a cross-sectional view showing a configuration of a light emitting section according to a modification example 3.

As shown in FIG. 10, the wavelength conversion films 38 cover each opposite end of the adjacent containers 32. As with the wavelength conversion section 37 on the above-described light emitting unit 2, the wavelength conversion film 38 is intended to convert a wavelength of the light v2 heading from the light source 10 toward a position between the adjacent containers 32, and is formed by a fluorescent paint applied on the end of the container 32, for example.

Third Embodiment

A light emitting unit (light emitting unit 3) according to a third embodiment of the present disclosure has a color unevenness prevention structure using a pitch (pitch P2) between the closest light sources 10 arranged between the adjacent light emitting sections 10E, that is, a pitch between the light source 10 at an end of the light emitting section 10E and the light source 10 closest thereto of the adjacent light emitting section 10E. Except for this point, the light emitting unit 3 has the same configuration as with the light emitting unit 1 according to the above-described first embodiment of the present disclosure, and the same goes for the operation and advantageous effects thereof as well.

Figure 11:
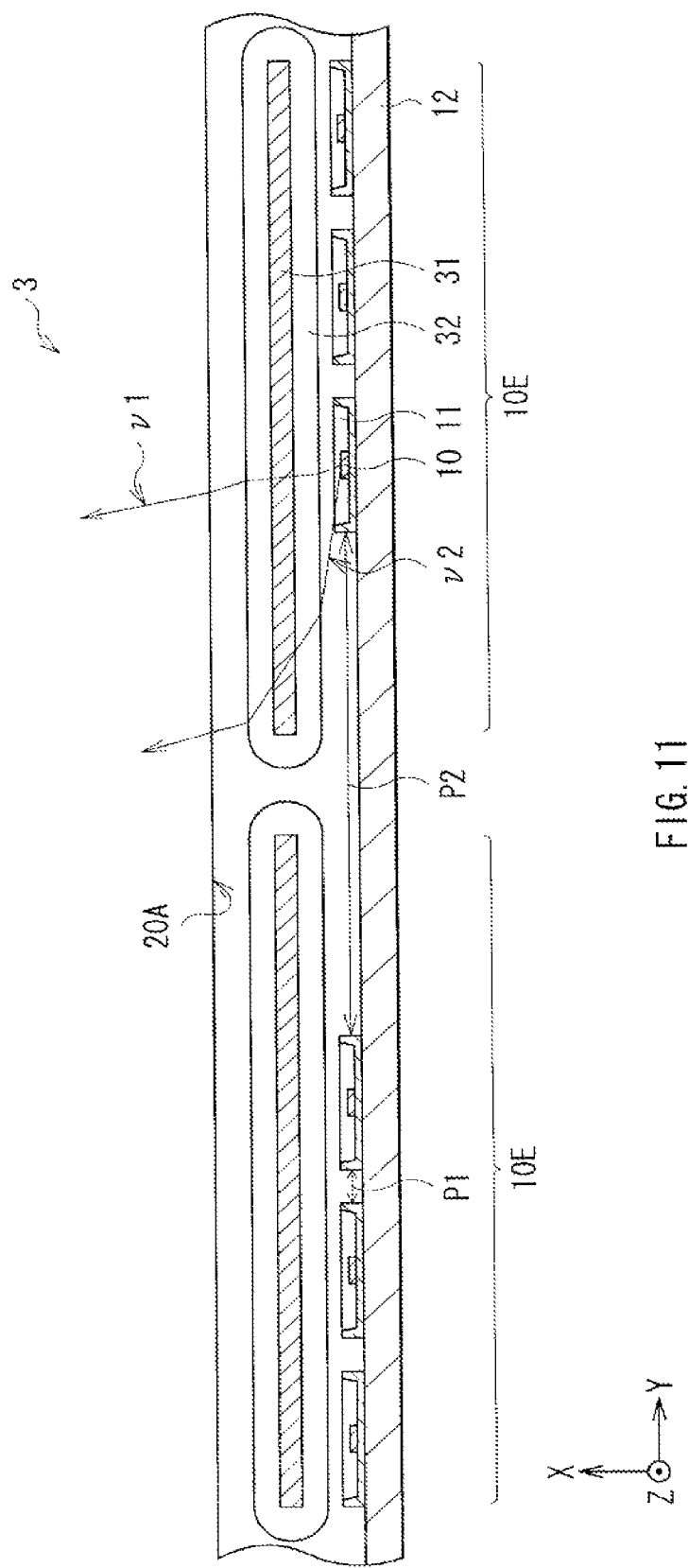
FIG. 11 is a cross-sectional view showing a configuration of a light emitting section according to a third embodiment of the present technology.

As shown in FIG. 11, the plurality of light sources 10 within one light emitting section 10E is arrayed at a predetermined pitch P1 (first pitch), whereas the closest light sources 10 between the adjacent light emitting sections 10E are arranged at the pitch P2 (second pitch) greater than the pitch P1. In the third embodiment of the present disclosure, the pitch P2 prevents light from the light source 10 from directly coming into the light incident surface 20A of the light guide plate 20.

In the light emitting unit 3, the adjacent light sources 10 arranged at the pitch P2 are provided at more inner side of the wavelength conversion member 30 as compared with a case where the light sources 10 are arranged at the pitch P1 same as that between the other light sources 10. Accordingly, much of the light v2 heading from the light sources 10 arranged at the pitch P2 toward a position between the adjacent wavelength conversion members 30 passes through the wavelength conversion material 31. This makes it possible to reduce the amount of light incoming into the light incident surface 20A of the light guide plate 20 directly from the light sources 10, thereby allowing to enhance the color uniformity.

Figure 12:
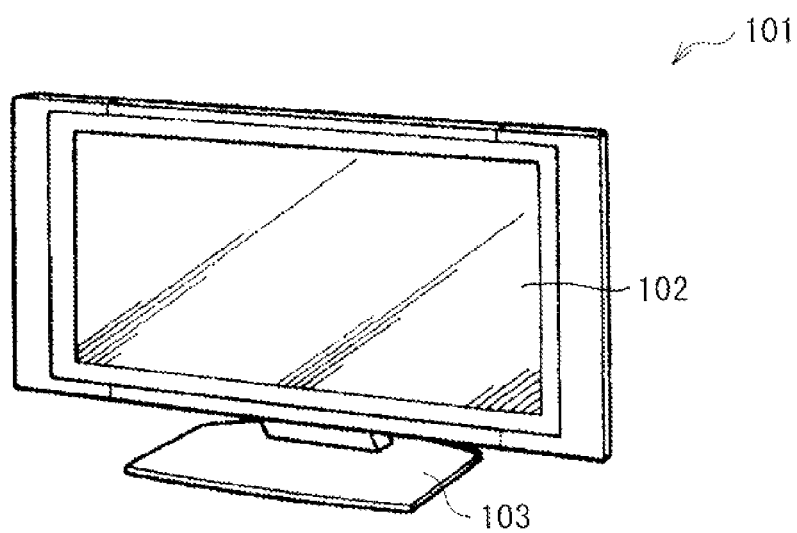
FIG. 12 is a perspective view showing an example of an external appearance of a display to which the light emitting unit illustrated in FIG. 1 and the like is applied.

FIG. 12 shows an external appearance of a display 101 to which the above-described light emitting unit 1 (or any one of the light emitting units 1A, 1B, 2, 2A, and 3) is applied. The display 101 is used, for example, as a flat-screen television receiver, and has a configuration where a flat-plate-shaped main body section 102 for an image display is supported with a stand 103. It is to be noted that the display 101 is used as a stationary type that is placed on a horizontal surface such as a floor, a shelf, and a table with the stand 103 attached to the main body section 102, although may be alternatively used as a wall-hanging type with the stand 103 detached from the main body section 102.

Figure 13:
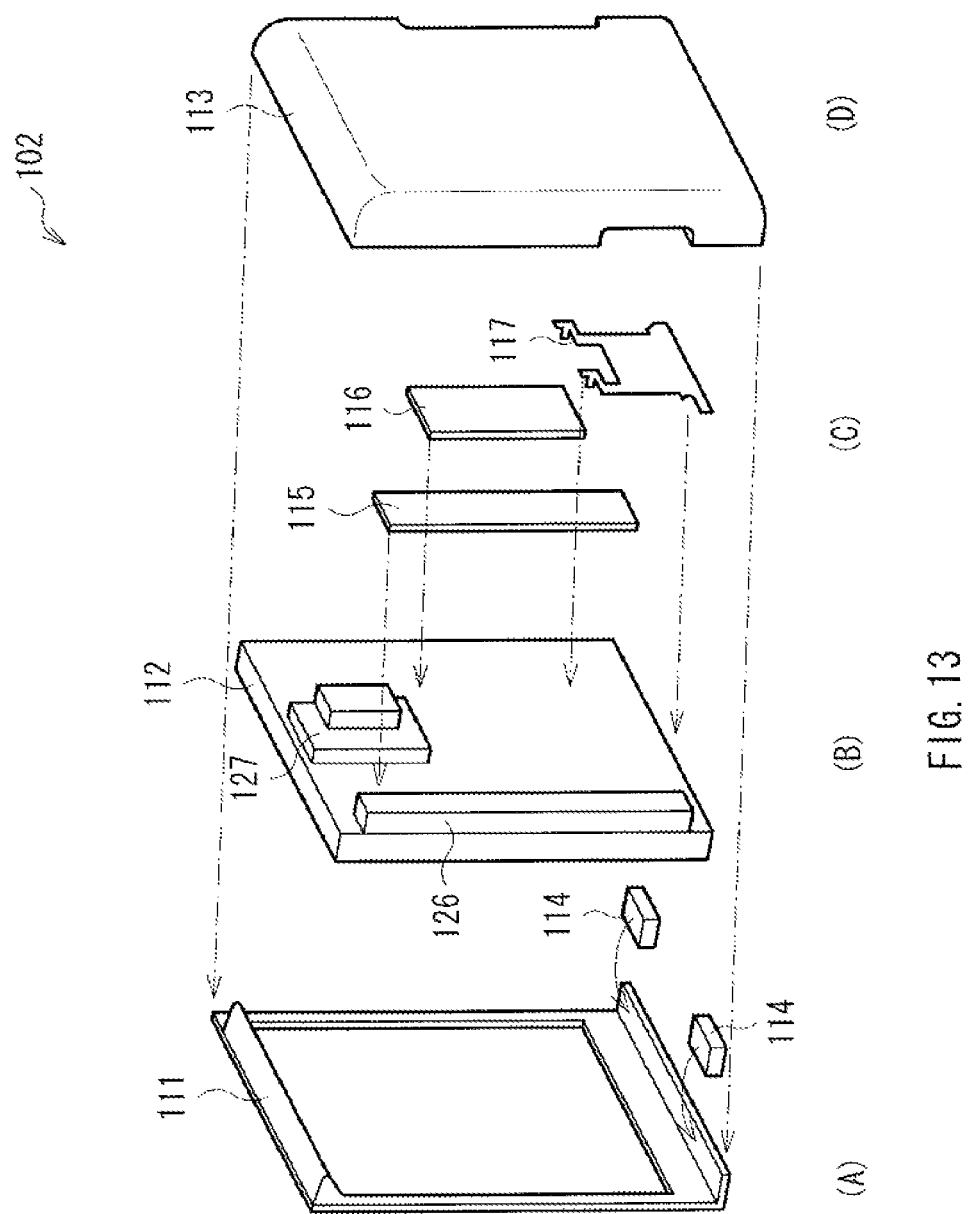
FIG. 13 is an exploded perspective view showing a main body section illustrated in FIG. 12.

FIG. 13 is an exploded perspective view showing the main body section 102 illustrated in FIG. 12. The main body section 102 has, for example, a front exterior member (bezel) 111, a panel module 112, and a rear exterior member (rear cover) 113 in this order from the front side (viewer side). The front exterior member 111 is a bezel-shaped member that covers a front peripheral section of the panel module 112, and has a pair of speakers 114 disposed at the lower side thereof. The panel module 112 is fixed to the front exterior member 111, and a power supply substrate 115 and a signal substrate 116 are mounted as well as a attachment metal part 117 is secured at the rear side thereof. The attachment metal part 117 is intended for attachment of a wall-mounting bracket, substrates, and the stand 103. The rear exterior member 113 covers a rear side and lateral sides of the panel module 112.

Figure 14:
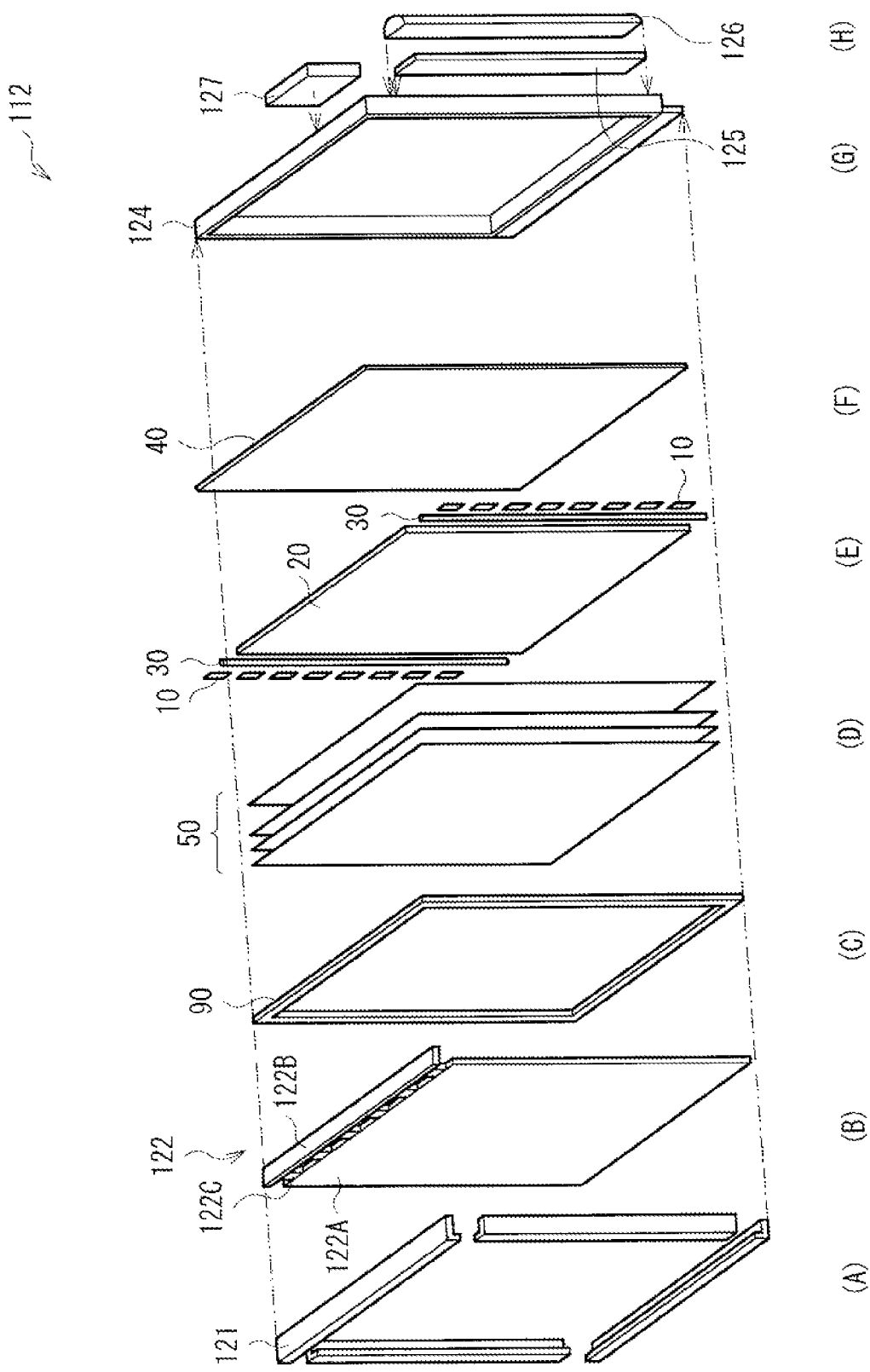
FIG. 14 is an exploded perspective view showing a panel module illustrated in FIG. 13.

FIG. 14 is an exploded perspective view showing the panel module 112 illustrated in FIG. 13. The panel module 112 has, for example, a front housing (top chassis) 121, a liquid crystal panel 122, a frame-formed member (middle chassis) 90, the light emitting unit 1, a rear housing (rear chassis) 124, a balancer substrate 125, a balancer cover 126, and a timing control substrate 127 in this order from the front side (viewer side).

The front housing 121 is a frame-formed metal component that covers a front peripheral section of the liquid crystal panel 122. The liquid crystal panel 122 has, for example, a liquid crystal cell 122A, a source substrate 122B, and a flexible substrate 122C such as a COF (Chip On Film) connecting the liquid crystal cell 122A and the source substrate 122B. The frame-formed member 90 is a frame-formed resin component that holds the liquid crystal panel 122 and the optical sheet 50 on the light emitting unit 1. The rear housing 124 is a metal component made of iron (Fe) and the like that houses the liquid crystal panel 122, the frame-formed member 90, and the light emitting unit 1. The balancer substrate 125 is intended to control the light emitting unit 1, and is mounted at the rear side of the rear housing 124 as well as is covered by the balancer cover 126 as shown in FIG. 14. The timing control substrate 127 is also mounted at the rear side of the rear housing 124.

In the display 101, an image display is carried out in such a manner that light from the light emitting unit 1 is transmitted selectively by the liquid crystal panel 122. Here, as represented in the above-described embodiments of the present disclosure, the light emitting unit 1 with the enhanced uniformity of an in-plane color of light is provided, and thus the display 101 is capable of performing a high-quality display.

Hereinafter, the descriptions are provided on examples where the panel module 112 as described above is applied to electronic apparatuses. Examples of the electronic apparatuses may include a television receiver, a digital camera, a notebook personal computer, a mobile terminal including a cellular phone, and a video camera. In other words, the above-described display is applicable to electronic apparatuses in every field that display externally-input image signals or internally-generated image signals as images or video pictures.

Application Example 1

Figure 15A:
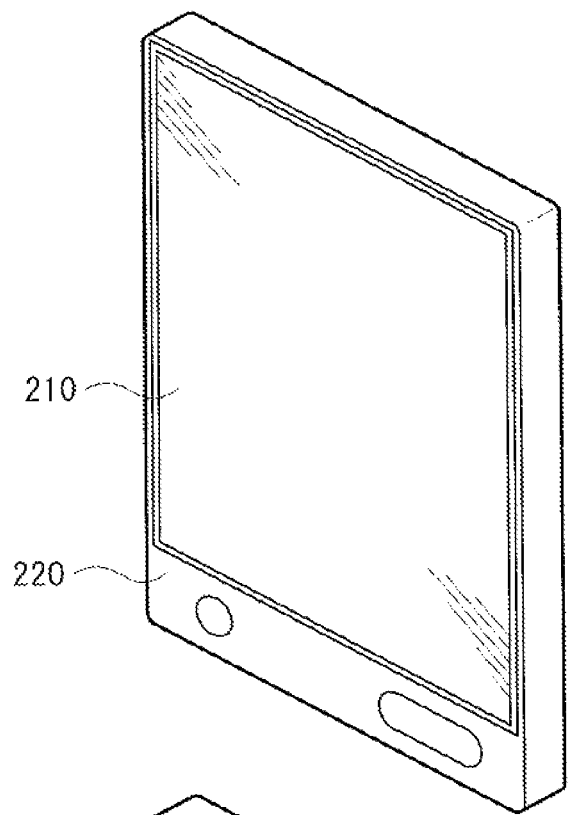
FIGS. 15A and 15B are each a perspective view showing an external appearance of an application example 1 of the panel module illustrated in FIG. 13.
Figure 15B:
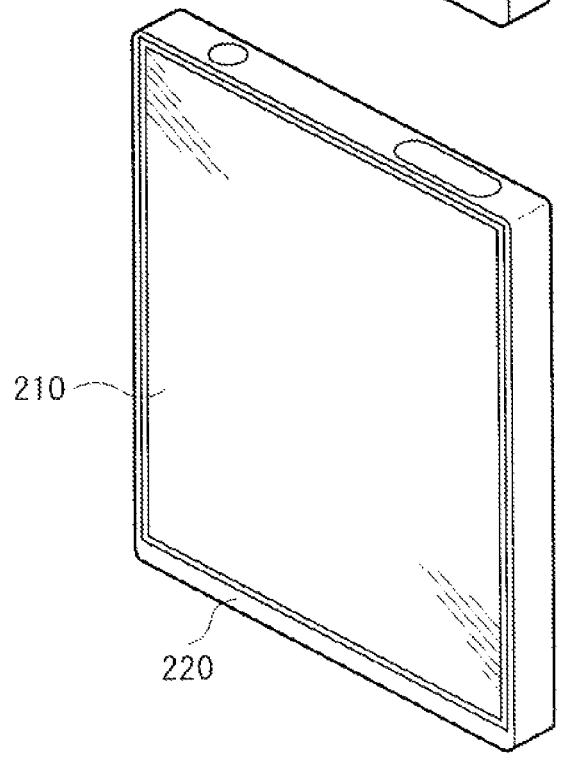

Each of FIGS. 15A and 15B shows an external appearance of an electronic book to which the panel module 112 according to the above-described embodiment of the present disclosure is applicable. The electronic book has, for example, a display section 210 and a nondisplay section 220, and the display section 210 is composed of the display 101 according to the above-described embodiment of the present disclosure.

Application Example 2

Figure 16:
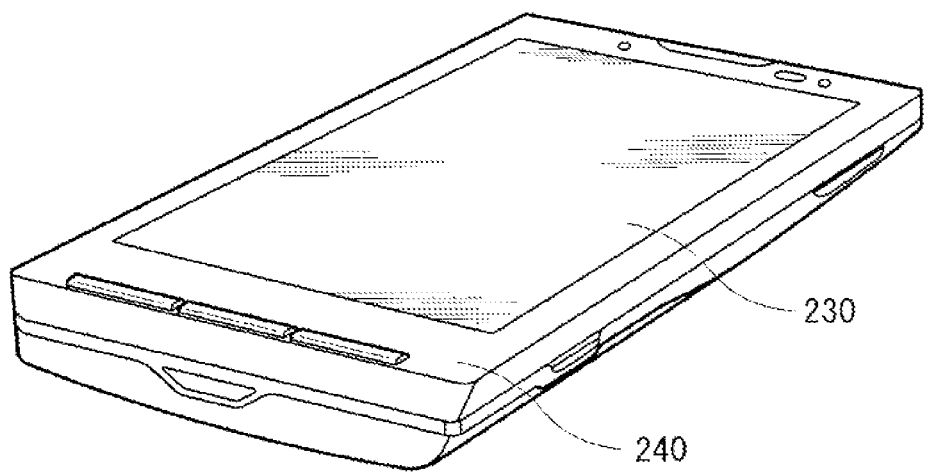
FIG. 16 is a perspective view showing an external appearance of an application example 2.

FIG. 16 shows an external appearance of a smartphone to which the panel module 112 according to the above-described embodiment of the present disclosure is applicable. The smartphone has, for example, a display section 230 and a nondisplay section 240, and the display section 230 is composed of the display 101 according to the above-described embodiment of the present disclosure.

Application Example 3

Figure 17A:
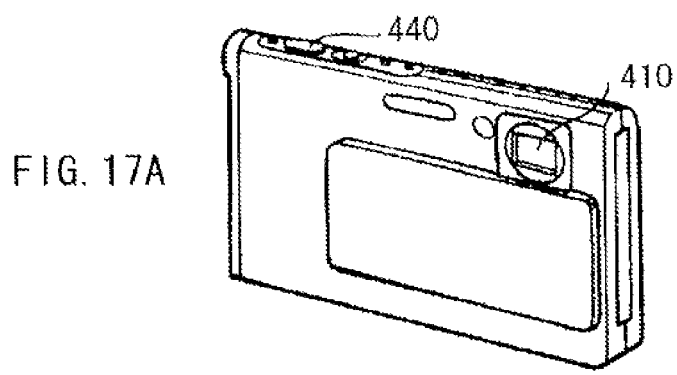
FIG. 17A is a perspective view showing an external appearance of an application example 3 as viewed from the front side thereof.
Figure 17B:
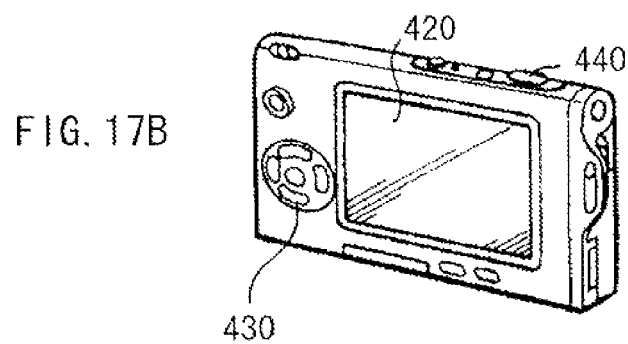
FIG. 17B is a perspective view showing an external appearance thereof as viewed from the rear side.

Each of FIGS. 17A and 17B shows an external appearance of a digital camera to which the panel module 112 according to the above-described embodiment of the present disclosure is applicable. The digital camera has, for example, a light emitting section 410 for flashing, a display section 420, a menu switch 430, and a shutter button 440, and the display section 420 is composed of the display 101 according to the above-described embodiment of the present disclosure.

Application Example 4

Figure 18:
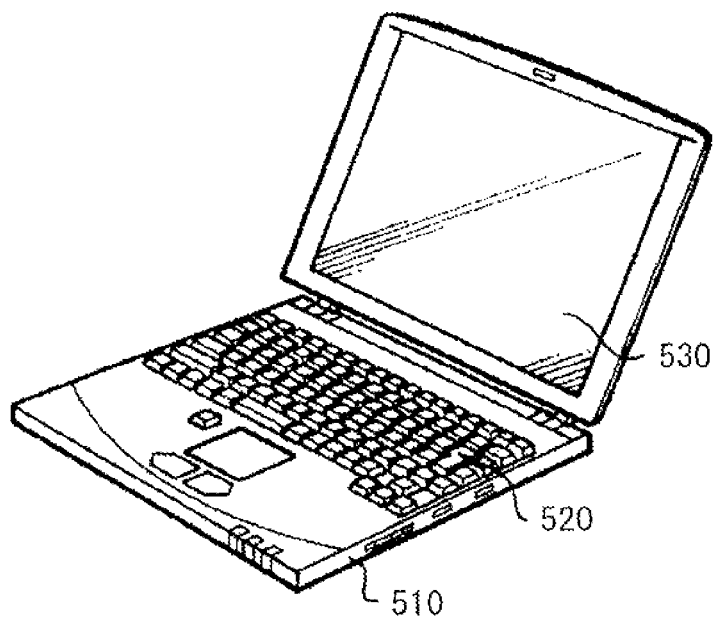
FIG. 18 is a perspective view showing an external appearance of an application example 4.

FIG. 18 shows an external appearance of a notebook personal computer to which the panel module 112 according to the above-described embodiment of the present disclosure is applicable. The notebook personal computer has, for example, a main body 510, a keyboard 520 for operation of inputting characters and the like, and a display section 530 for image display, and the display section 530 is composed of the display 101 according to the above-described embodiment of the present disclosure.

Application Example 5

Figure 19:
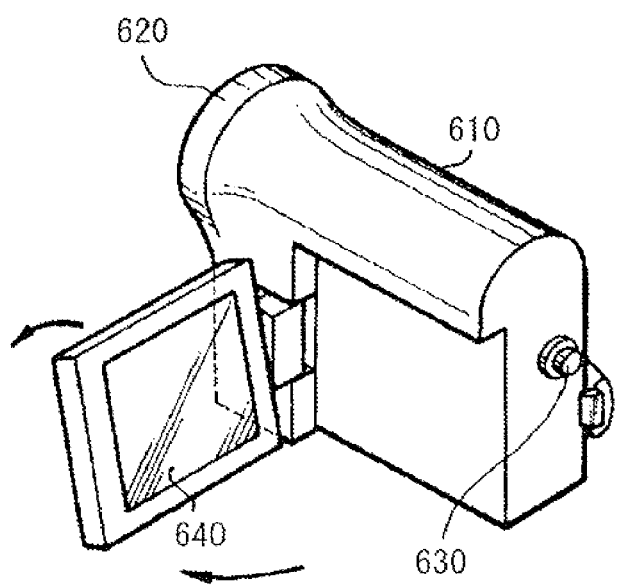
FIG. 19 is a perspective view showing an external appearance of an application example 5.
Figure 20:
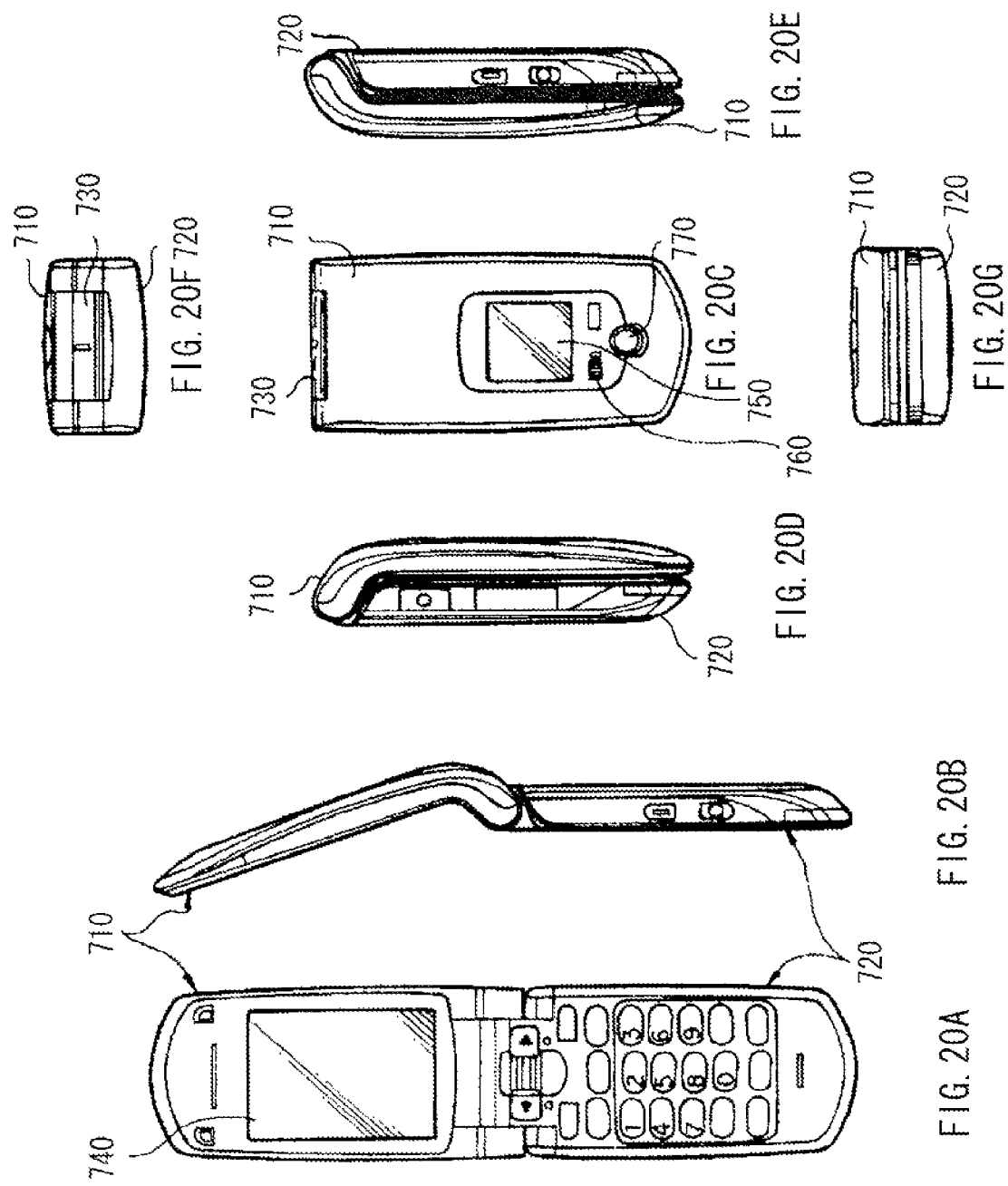
FIG. 20A is a front view of an application example 6 in an open state.
FIG. 20B is a side view thereof.
FIG. 20C is a front view in a closed state.
FIG. 20D is a left-side view.
FIG. 20E is a right-side view.
FIG. 20F is a top view.
FIG. 20G is a bottom view.

FIG. 19 shows an external appearance of a video camera to which the panel module 112 according to the above-described embodiment of the present disclosure is applicable. The video camera has, for example, a main body section 610, a lens 620 that is for shooting an image of a subject and is provided at the front lateral side of the main body section 610, a start-and-stop switch 630 for starting or stopping the shooting of the image of the subject, and a display section 640. The display section 640 is composed of the display 101 according to the above-described embodiment of the present disclosure.

Application Example 6

FIGS. 20A to 20G each show an external appearance of a cellular phone to which the panel module 112 according to the above-described embodiment of the present disclosure is applicable. For example, the cellular phone is composed of an upper chassis 710 and a lower chassis 720 that are joined with a coupling section (hinge section) 730, and has a display 740, a sub-display 750, a picture light 760, and a camera 770. The display 740 or the sub-display 750 is composed of the display 101 according to the above-described embodiment of the present disclosure.

Figure 21:
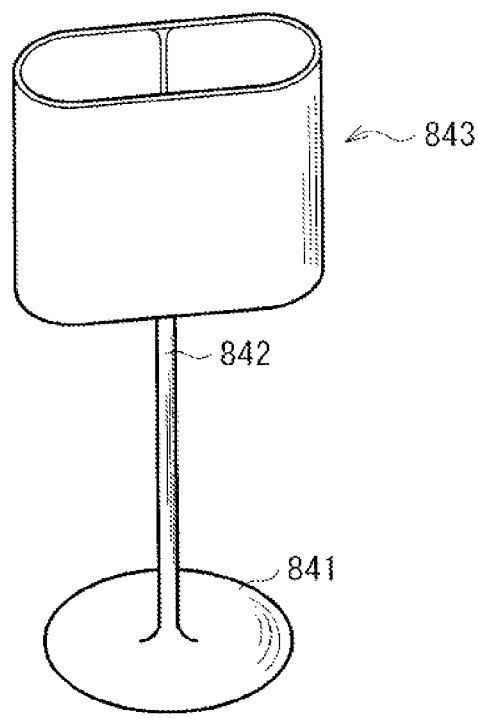
FIG. 21 is a perspective view showing an example of an external appearance of a lighting apparatus to which the light emitting unit illustrated in FIG. 1 and the like is applied.
Figure 22:
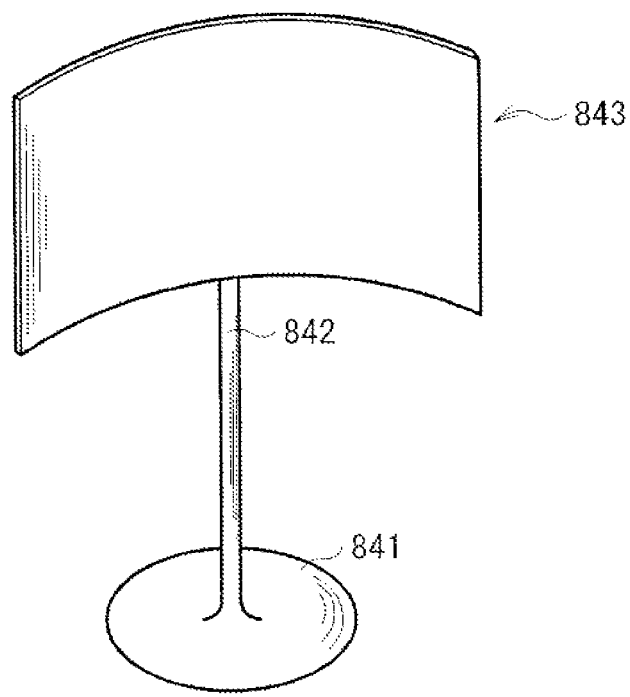
FIG. 22 is a perspective view showing another example of the lighting apparatus illustrated in FIG. 21.

FIG. 21 shows an external appearance of a lighting apparatus to which the above-described light emitting unit 1 (or any one of the light emitting units 1A, 1B, 2, 2A, and 3) is applicable. The lighting apparatus is a tabletop lighting apparatus with the built-in light emitting unit 1 (or any one of the light emitting units 1A, 1B, 2, 2A, and 3) according to the above-described embodiments of the present disclosure, and, for example, an illumination section 843 is attached to a support pole 842 that is provided on a base 841. The illumination section 843 is composed of the light emitting unit 1 or 2 according to the above-described first or second embodiment of the present disclosure. By forming the light guide plate 20 in a curved shape, it is possible to form the illumination section 843 in any shape such as a tubular shape illustrated in FIG. 21, or a curved shape illustrated in FIG. 22.

Figure 23:
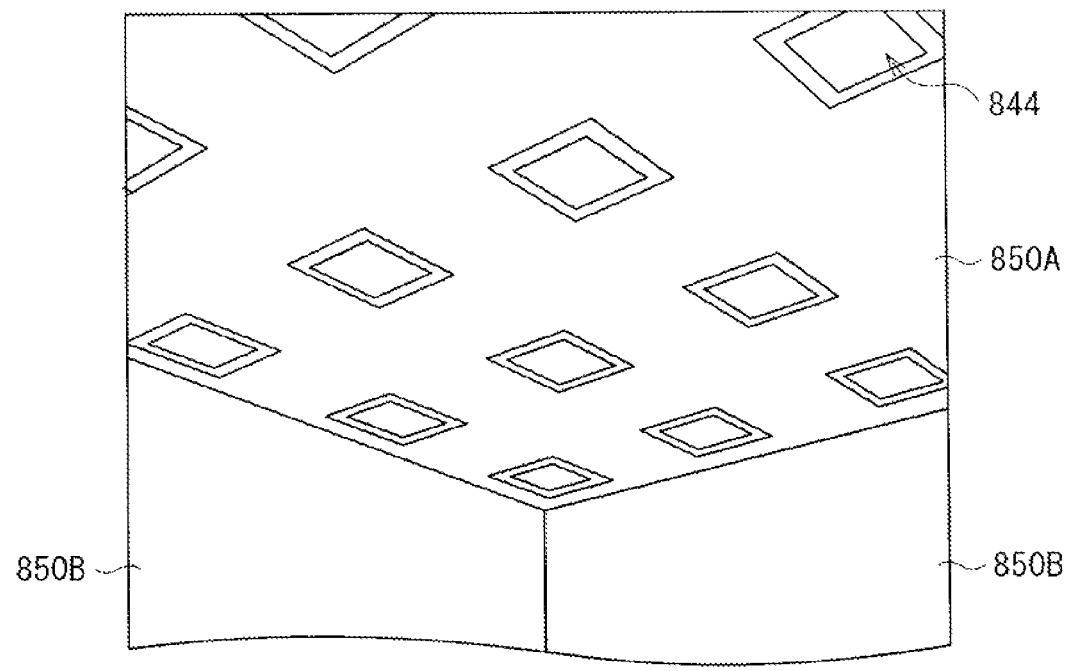
FIG. 23 is a perspective view showing still another example of the lighting apparatus illustrated in FIG. 21.

The light emitting unit 1 may be applicable to an interior lighting apparatus as shown in FIG. 23. In this lighting apparatus, an illumination section 844 is composed of the above-described light emitting unit 1. An appropriate number of the illumination sections 844 are disposed at appropriate spacing intervals on a ceiling 850A of a building room. It is to be noted that a mounting location of the illumination section 844 is not limited to the ceiling 850A, but the illumination section 844 may be installed on any locations including a wall 850B or a floor (not shown in the drawing) depending on intended applications.

In these lighting apparatuses, illumination is carried out using light from the light emitting unit 1. Hereupon, as represented in the above-described embodiments of the present disclosure, the light emitting unit 1 with the enhanced uniformity of an in-plane color of light is provided, which makes it possible to obtain light of uniform color.

As above, the present technology is described with reference to the respective embodiments and modification examples, although the present technology is not limited to the above-described respective embodiments of the present disclosure, but different variations are available. For example, in the above-described respective embodiments of the present disclosure and the like, the description is provided on use of the light source 10 that generates blue-color light, although the light source 10 may be a light source that generates other color light such as red-color light and green-color light. Further, in the above-described respective embodiments of the present disclosure and the like, the description is provided on a case where white-color light is generated from blue-color light by making the blue-color light pass through the wavelength conversion member 30, although an arrangement may be made to obtain any color light other than white-color light such as orange-color light and red-color light.

Additionally, in the above-described respective embodiments of the present disclosure and the like, the description is provided on a case where the light incident surface 20A of the light guide plate 20 corresponds to both left and right end surfaces, although the light incident surface 20A may be one or three or more of four end surfaces (left, right, top, and bottom) surrounding a principal surface. Alternatively, it is also possible to dispose the light source 10 at a position opposite to a principal surface of the light guide plate 20 and have a direct type of the light emitting unit 1 (or light emitting unit 2). Further, a planar shape of the light guide plate 20 may be tailored to fit a shape of an object to be irradiated by the light emitting unit 1, and may be in any form other than a rectangular shape. Moreover, in the above-described respective embodiments of the present disclosure and the like, the description is provided on a case where the light guide plate 20 is used as an optical component, although light may be guided to the optical sheet 50 side using a structure such as a back chassis of the display 101 and the like instead of the light guide plate 20.

Further, in the above-described respective embodiments of the present disclosure and the like, the description is provided on a case where the light source 10 is an LED, although the light source 10 may be composed of a semiconductor laser or the like.

Moreover, in the above-described respective embodiments of the present disclosure, the description is provided on configurations of the light emitting units 1 and 2, the display 101 (television receiver), and the like by citing concrete examples, although it is not necessary to provide all the component parts, and any other component parts may be provided additionally.

Further, for example, a material, a thickness, and the like of each component that are represented in the above-described respective embodiments of the present disclosure are not limited thereto, but any other materials and thicknesses may be permitted.

It is to be noted that the present technology may be configured as follows.

(1) A light emitting unit, including:

a plurality of light emitting sections each having a light source and a wavelength conversion member, the wavelength conversion member converting a wavelength of light emitted from the light source;

an optical component having a light incident surface in opposition to the plurality of light emitting sections; and a color unevenness prevention structure suppressing direct entering of light from the light source into the optical component.

(2) The light emitting unit according to (1), wherein the color unevenness prevention structure is composed of a light-shielding section between the wavelength conversion members adjacent to each other.

(3) The light emitting unit according to (2), wherein the light-shielding section is a reflection section that returns light heading directly from the light source toward the optical component back to the wavelength conversion member side.

(4) The light emitting unit according to (3), further including a holder holding the plurality of wavelength conversion members and including a barrier section between the wavelength conversion members adjacent to each other, wherein the reflection section is composed of the barrier section of the holder.

(5) The light emitting unit according to (1), wherein the color unevenness prevention structure is composed of a wavelength conversion section between the wavelength conversion members adjacent to each other.

(6) The light emitting unit according to (5), wherein the wavelength conversion member includes a wavelength conversion material sealed in a tubular container.

(7) The light emitting unit according to (6), wherein the wavelength conversion section is a wavelength conversion film covering each ends of the containers adjacent to each other and containing a fluorescent painting material.

(8) The light emitting unit according to (6), wherein the wavelength conversion section is a resin containing a fluorescent material that is provided between the containers adjacent to each other.

(9) The light emitting unit according to (4), further including a buffer section, wherein the holder has a sidewall in opposition to the barrier section with the wavelength conversion member interposed between, and the buffer section is provided between the sidewall and the wavelength conversion member.

(10) The light emitting unit according to (1), wherein one of the light emitting sections has a plurality of light sources that are arranged at a first pitch, and the color unevenness prevention structure is configured using a second pitch greater than the first pitch, the second pitch being a pitch between the closest two light sources arranged between the adjacent light emitting sections.

(11) The light emitting unit according to (2), wherein the light-shielding section is a light absorber section that absorbs light heading directly from the light source toward the optical component.

(12) The light emitting unit according to any one of (1) to (11), wherein the wavelength conversion member includes quantum dots.

(13) The light emitting unit according to any one of (1) to (12), wherein the optical component is a light guide plate, and the light incident surface is an end surface of the light guide plate.

(14) The light emitting unit according to any one of (1) to (13), wherein the light source is a blue-color light source.

(15) The light emitting unit according to any one of (1) to (14), wherein the light source is an LED.

(16) The light emitting unit according to (6), wherein the container is made of glass.

(17) A display with a light emitting unit at a rear side of a liquid crystal panel, the light emitting unit including:

a plurality of light emitting sections each having a light source and a wavelength conversion member, the wavelength conversion member converting a wavelength of light emitted from the light source;

an optical component having a light incident surface in opposition to the plurality of light emitting sections; and a color unevenness prevention structure suppressing direct entering of light from the light source into the optical component.

(18) A lighting apparatus with a light emitting unit, the light emitting unit including:

a plurality of light emitting sections each having a light source and a wavelength conversion member, the wavelength conversion member converting a wavelength of light emitted from the light source;

an optical component having a light incident surface in opposition to the plurality of light emitting sections; and a color unevenness prevention structure suppressing direct entering of light from the light source into the optical component.

It should be understood by those skilled in the art that various modifications, combinations, sub-combinations and alterations may occur depending on design requirements and other factors insofar as they are within the scope of the appended claims or the equivalents thereof.

What is claimed is:

1. A display comprising:

a liquid crystal display panel; and a lighting apparatus positioned on a rear side of the liquid crystal display panel, wherein the lighting apparatus comprises:

a plurality of light emitting sections each having a light source and a wavelength conversion member, the wavelength conversion member converting a wavelength of light emitted from the light source, the wavelength conversion member including a wavelength conversion material that includes quantum dots;

an optical component having a light incident surface in opposition to the plurality of light emitting sections, in which the optical component includes a light emission surface that faces the rear side of the liquid crystal display panel and is perpendicular to the light incident surface, in which the light emission surface has an uneven pattern; and a prevention structure suppressing entry of light from a first light emitting section into an adjacent light emitting section, and in which the prevention structure has a number of concave sections, each concave section being configured in relation to a respective end of a respective one of plurality of light emitting sections.

2. The display of claim 1, wherein the wavelength conversion material is sealed in a tubular container.

3. The display of claim 2, wherein the prevention structure includes a wavelength conversion section between the wavelength conversion members adjacent to each other, in which the wavelength conversion section is a wavelength conversion film covering each end of the container adjacent to each other and containing a fluorescent material.

4. The display of claim 3, wherein the uneven pattern of the optical component comprises convex sections.

5. A display comprising:

a liquid crystal display panel; and a lighting apparatus positioned on a rear side of the liquid crystal display panel, wherein the lighting apparatus comprises:

light sources and a wavelength conversion member, the wavelength conversion member converting a wavelength of light emitted from the light sources, the wavelength conversion member including a wavelength conversion material that includes quantum dots;

an optical component having a light incident surface in opposition to the light sources, in which the optical component includes a light emission surface that faces the rear side of the liquid crystal display panel;

at least one light source substrate that supports the light sources; and a prevention structure having one or more concave sections, the prevention structure being arranged relative to a first light source and associated first wavelength conversion member such that light from the first light source is prevented from being absorbed by neighboring conversion member regions.

6. The display of claim 5, wherein the light emission surface has an uneven pattern.

7. The display of claim 6, wherein the uneven pattern of the optical component comprises convex sections.

8. The display of claim 5, wherein the light sources are light emitting diodes that generate blue light.

9. The display of claim 8, wherein the at least one light source substrate has a wiring pattern.

10. The display of claim 9, wherein the optical component is a waveguide.

11. A light emitting unit comprising:
a plurality of light emitting sections each having a light source and a wavelength conversion member, wherein each said light source is configured to emit light in a first wavelength range, and wherein each said wavelength conversion member includes a wavelength conversion material and is configured to convert the emitted light in the first wavelength range;
an optical guide component having a light incident surface in opposition to the plurality of light emitting sections; and
a prevention structure configured to suppress the emitted light in the first wavelength range from entering into the optical guide component,
wherein the prevention structure includes a wavelength conversion section disposed between at least a pair of adjacent wavelength conversion members, and the wavelength conversion member is spaced from and confronts a respective end of each of the adjacent wavelength conversion members, and in which the prevention structure has a number of circular concave sections, each concave section being configured in relation to the respective end of a respective one of the adjacent wavelength conversion members.

12. The light emitting unit according to claim 11, wherein the prevention structure absorbs the emitted light in the first wavelength range heading directly toward the optical guide component.

13. The light emitting unit according to claim 11, wherein the prevention structure is a color unevenness prevention structure composed of the wavelength conversion section.

14. The light emitting unit according to claim 11, wherein the prevention structure includes a wavelength conversion film containing a fluorescent painting material.

15. The light emitting unit according to claim 11, wherein the wavelength conversion member includes quantum dots.

16. The light emitting unit according to claim 11, wherein the optical guide component is a light guide plate, and the light incident surface is an end surface of the light guide plate.

17. The light emitting unit according to claim 11, wherein the light source is a blue-color light source.

18. The light emitting unit according to claim 11, wherein the light source is an LED.

19. The light emitting unit according to claim 11, wherein each said wavelength conversion member is sealed in a tubular container.

20. The light emitting unit according to claim 19, wherein each said tubular container is made of glass.

21. The light emitting unit according to claim 11, in which the wavelength conversion member is configured to absorb blue-color light emitted from the light source to convert a part of the blue-color light into light in a red-color light range or a green-color light range so that the light emitted from the light source passes through the wavelength conversion member, in which the wavelength conversion member is configured to synthesize given light in a given red-color light range, given light in a given green-color light range, and given light in a given blue-color light range to generate white-color light.

22. The light emitting unit according to claim 21, in which the red-color light range is a wavelength range from about 620 nm to about 750 nm and the green-color light range is a wavelength range from about 495 nm to about 570 nm.

* * * * *